(12) United States Patent
Modi et al.

(10) Patent No.: US 10,199,354 B2
(45) Date of Patent: Feb. 5, 2019

(54) DIE SIDEWALL INTERCONNECTS FOR 3D CHIP ASSEMBLIES

(71) Applicant: INTEL CORPORATION, Santa Clara, CA (US)

(72) Inventors: Mitul Modi, Phoenix, AZ (US); Digvijay A. Raorane, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/385,673

(22) Filed: Dec. 20, 2016

(65) Prior Publication Data

US 2018/0174999 A1     Jun. 21, 2018

(51) Int. Cl.
*H01L 25/065*     (2006.01)
*H01L 27/1157*    (2017.01)
(Continued)

(52) U.S. Cl.
CPC .......... *H01L 25/0652* (2013.01); *H01L 21/78* (2013.01); *H01L 24/03* (2013.01); *H01L 24/08* (2013.01); *H01L 27/1157* (2013.01); *H01L 27/11524* (2013.01); *H01L 2224/0331* (2013.01); *H01L 2224/08501* (2013.01); *H01L 2225/06527* (2013.01); *H01L 2225/06551* (2013.01)

(58) Field of Classification Search
CPC ............ H01L 25/0652; H01L 27/1157; H01L 27/11524; H01L 21/78; H01L 24/08; H01L 24/03; H01L 2224/08501; H01L 2225/06527; H01L 2225/06551; H01L 24/0331
See application file for complete search history.

(56) References Cited

U.S. PATENT DOCUMENTS 5,696,030 A    12/1997 Cronin
6,034,438 A     3/2000 Petersen
(Continued)

OTHER PUBLICATIONS

International Search Report and Written Opinion for International Patent Application No. PCT/US17/62308, dated Mar. 29, 2018.

*Primary Examiner* — Dung Le
(74) *Attorney, Agent, or Firm* — Green, Howard & Mughal LLP

(57) ABSTRACT

A stacked-chip assembly including an IC chip or die that is electrically interconnected to another chip and/or a substrate by one or more traces that are coupled through sidewalls of the chip. Electrical traces extending over a sidewall of the chip may contact metal traces of one or more die interconnect levels that intersect the chip edge. Following chip fabrication, singulation may expose a metal trace that intersects the chip sidewall. Following singulation, a conductive sidewall interconnect trace formed over the chip sidewall is to couple the exposed trace to a top or bottom side of a chip or substrate. The sidewall interconnect trace may be further coupled to a ground, signal, or power rail. The sidewall interconnect trace may terminate with a bond pad to which another chip, substrate, or wire lead is bonded. The sidewall interconnect trace may terminate at another sidewall location on the same chip or another chip.

17 Claims, 19 Drawing Sheets

(51) Int. Cl.
    *H01L 27/11524*    (2017.01)
    *H01L 21/78*        (2006.01)
    *H01L 23/00*        (2006.01)

(56) References Cited

U.S. PATENT DOCUMENTS

| | | | |
|---|---|---|---|
| 2004/0201089 A1 | 10/2004 | Yamaguchi | |
| 2008/0006921 A1* | 1/2008 | Park | H01L 23/3128 257/686 |
| 2009/0065916 A1* | 3/2009 | Crane | H01L 24/24 257/676 |
| 2009/0134527 A1* | 5/2009 | Chang | H01L 24/25 257/777 |
| 2009/0230528 A1 | 9/2009 | McElrea et al. | |
| 2010/0117224 A1* | 5/2010 | McElrea | H01L 24/82 257/723 |
| 2011/0249512 A1* | 10/2011 | Mochizuki | G11C 16/08 365/189.05 |
| 2014/0054783 A1* | 2/2014 | Gong | H01L 24/97 257/773 |
| 2014/0361441 A1 | 12/2014 | Bae et al. | |
| 2015/0064899 A1 | 3/2015 | Ji et al. | |
| 2015/0137389 A1* | 5/2015 | Du | H01L 24/24 257/777 |

* cited by examiner

DIE SIDEWALL INTERCONNECTS FOR 3D CHIP ASSEMBLIES

BACKGROUND

There are many integrated circuit (IC) chip, or die, packaging technologies. A number of advanced IC packages include a plurality of IC chips in a stack, which reduce the footprint of the IC chips to improve packaged device density within a given platform (e.g., mobile device, computer, automobile). For stacked memory chips, a first memory IC chip may be stacked over a second memory IC chip 110, the second memory IC chip may be further stacked over a third IC chip, and so on. Between each IC chip there is typically a die attach material (e.g., paste or film). To accommodate electrical connection (e.g., power, signal, ground) by wire bonds, stacked chips may be laterally offset or displaced in one or more dimensions relative to an underlying/overlying chip. The wire bonds may be waterfalled from a top most chip to successively lower chips until landing on a package substrate or on a bottom die that is coupled to a substrate through bumps. Waterfalled wire bonds are typical in applications where the chips in the stack are the same and various pads on each chip may be powered, grounded, or signaled concurrently with corresponding pads on another chip. This wire bond architecture is common for a NAND flash memory chip stack, which often accommodates metal features on one or two sides of the chip. Wire bonding an IC chip stack typically requires a footprint that is a function of both the chip size and the cumulative chip offset required for the wire bonds. As such, wire bonding the chip stack typically increases package size well beyond that of a single IC chip.

In alternative architectures, through-substrate vias (TSVs) may be fabricated into one or more of the IC chips in a stack. No offsets between stacked chips are needed in a TSV-based architecture, however TSVs are expensive to manufacture, reduce the device and/or trace routing density, and can detrimentally impact the performance of the active devices in a chip.

In still other 3D stacked-chip architectures, a smaller chip is bumped face-to-face with a larger chip and then pads on the larger chip's face not covered by the smaller chip are further bonded to a package substrate. Such an architecture often limits the minimum footprint of the larger die and/or package substrate.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1:
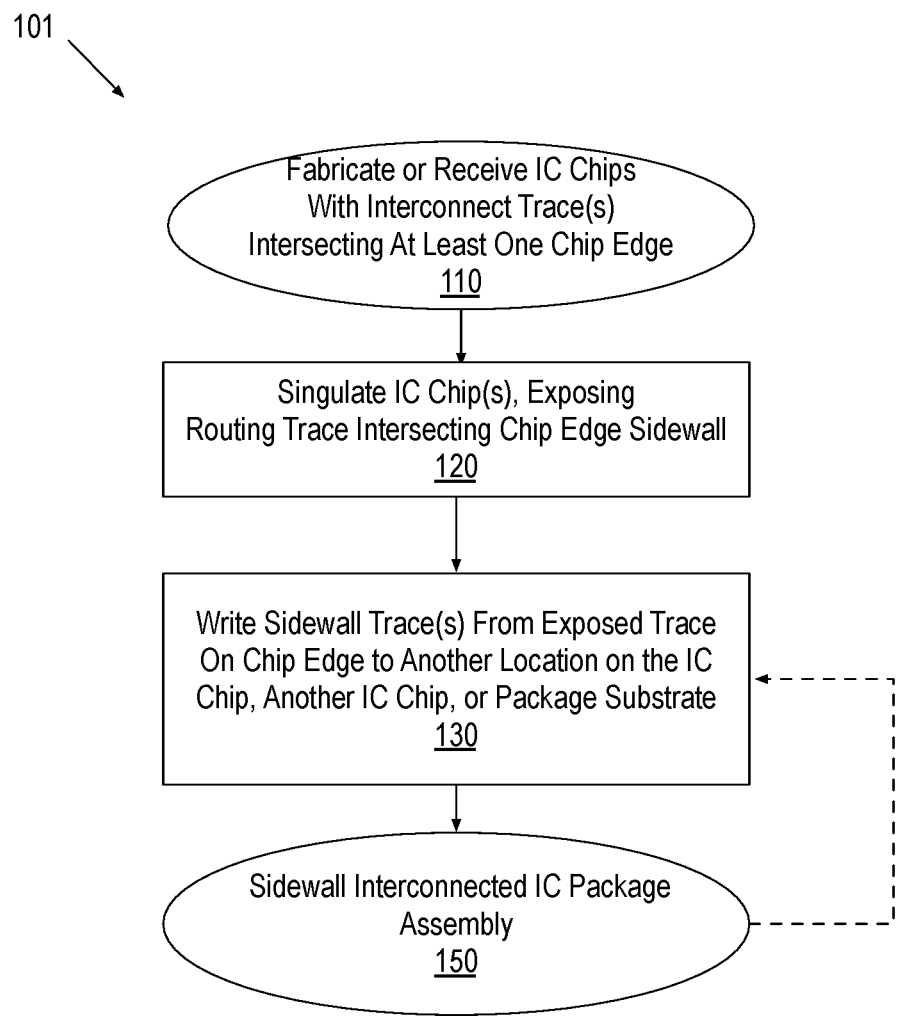
FIG. 1 illustrates a flow diagram of methods for fabricating a chip assembly including an IC chip with a sidewall interconnect, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings and are not intended to restrict the application of claimed subject matter. Therefore, the following detailed description is not to be taken in a limiting sense and the scope of claimed subject matter is defined solely by the appended claims and their equivalents.

In the following description, numerous details are set forth, however, it will be apparent to one skilled in the art, that embodiments may be practiced without these specific details. In some instances, well-known methods and devices are shown in block diagram form, rather than in detail, to avoid obscuring inventive aspects of the exemplary embodiments. References throughout this specification to "an embodiment" or "one embodiment" mean that a particular feature, structure, function, or characteristic described in connection with the embodiment is included in at least one embodiment. Thus, the appearances of the phrase "in an embodiment" or "in one embodiment" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the first and second embodiments are not mutually exclusive.

As used in the description of the exemplary embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

As described in greater detail below, a stacked-chip assembly includes IC chip or die that is electrically interconnected to another IC chip and/or a package substrate by one or more traces that are coupled through sidewalls of the IC chip. The IC chip signal I/O, power, and/or ground connections which are typically only routed one side of the chip may be also (or in the alternative) routed to the sides of the chip. Before or after die stacking, these side terminals may be connected to any stacked die or package substrate using a conductive ink, conductive paste, or other 3D compatible point to point connection methodology.

Electrical traces extending over a sidewall of the chip may contact metal traces of one or more die interconnect levels that intersect a chip sidewall or edge generated during the chip singulation process(es) performed after IC fabrication. Chip singulation may expose an interconnect trace fabricated into the streets or lanes between adjacent die, for example. Following singulation, a conductive sidewall interconnect trace may be formed over the chip sidewall (e.g., with a printing process) to electrically couple the trace exposed on the chip sidewall to a top or bottom side of the chip, and/or to a top, bottom, or sidewall of another chip, interposer, or a package substrate. The sidewall interconnect trace may couple the trace exposed at the chip edge to a ground, signal, or power rail. The sidewall interconnect trace may terminate with a pad or land to which another chip, wire lead, or solder feature may be bonded. The sidewall interconnect trace may terminate at another sidewall location on the same chip or another chip. The use of side terminals enables a direct connection between chips, for example using a highly conductive and short trace path. This approach may avoid the use of TSVs, but may also be used in combination with TSVs.

FIG. 1 illustrates a flow diagram of methods 101 for fabricating a chip assembly including an IC chip with a sidewall interconnect, in accordance with some embodiments. Methods 101 begin with fabricating or receiving one or more IC chips. At least one of the IC chips includes an interconnect trace at one or more interconnect levels (e.g., metal 1-metal 10) that extends into a region of a fabrication substrate that is to be cleaved, scribed, milled, ablated, scored, or otherwise processed during singulation. In some embodiments, at least one of the IC chips includes at least one interconnect trace that extends into a street, line, or space between two adjacent die of a monolithic die fabrication substrate. At operation 120, the monolithic fabrication substrate is cleaved, scribed, milled, ablated, scored, or otherwise processed along streets, lines, or spaces between adjacent die to singulate IC chips. This singulation may be by any known means and may advantageously bifurcate one or more of the interconnect traces that extend into the street, line, or space along which the cleave, scribe, ablation, etc. is performed. As such, following singulation operation 120, an end of an interconnect trace in one or more of the interconnect levels within a singulated IC chip is exposed at the IC chip edge sidewall.

Methods 101 continue at operation 130 where a sidewall trace is written, printed, or otherwise formed to contact the end of the interconnect trace exposed at the edge sidewall of an IC chip. The trace formed at operation 130 is referred to herein as a "sidewall" trace because it traverses at least a portion of the IC chip sidewall so as to make contact with the exposed interconnect trace and electrically couple this otherwise embedded trace with a power, or ground, or signal source/sink located elsewhere. The sidewall trace will typically, (but not necessarily) extend beyond the first IC chip sidewall to reach the power, or ground, or signal source/sink. For example, the sidewall trace may be formed so as to extend to a second location that is either also on the same IC chip (e.g., on an edge sidewall, the top side, or the bottom side of a first IC chip), or on another IC chip (e.g., on a top, bottom or edge sidewall of a second IC chip attached to the first IC chip), or on a package substrate (e.g., on a top side of a substrate to which the IC chip is mounted). Depending on the location where the sidewall trace is terminated, operation 130 may be performed before or after an IC chip is attached to other IC chips and/or to a package substrate. For example, where the sidewall trace is terminated on a top (or bottom) side of a first IC chip, operation 130 may be performed at any time after singulation of the first IC chip and before the top (or bottom) side of the first IC chip is attached to another chip, substrate, interposer, etc. Where a sidewall trace on a first IC chip is terminated on a surface of a second IC chip, or on a package substrate or interposer, etc., operation 130 may be performed after the first IC chip is attached to the other IC chip, package substrate or interposer, etc.

Any point-to-point electrical interconnection technique capable of contacting and/or traversing an edge sidewall of an IC chip may be employed to form the sidewall trace at operation 130. In some exemplary embodiments, a fluid ink is dispensed over the region where the sidewall trace is to be formed. In some other embodiments, a paste is extruded over the region where the sidewall trace is to be formed. In still other embodiments, a powder is deposited where the trace is to be formed. Other selective deposition techniques may also be employed to additively form the sidewall trace. Subtractive techniques (e.g., where a film is deposited and then subsequently selectively pattern etched) are also possible. For exemplary printing techniques, operation 130 may include a sintering, curing, and/or partial ablation (e.g., with a laser of suitable energy) of the printed ink, paste or power to fabricate the sidewall trace. The material printed may be a catalyst or precursor of conductive material that is subsequently processed to form the sidewall trace. Alternatively, a conductive material may be directly printed or otherwise deposited. Conductive trace printing techniques may be considered a subset of 3D printing, and some exemplary techniques are now being employed in the fabrication of flat panel displays (e.g., OLED, LCD, etc.).

In some embodiments, the sidewall trace formed at operation 130 is a metal or comprises particles of metal embedded in a matrix to render the composite sufficiently conductive. In an exemplary metallic trace embodiment, the sidewall trace is a metal including Ag. In an exemplary metallic trace embodiment, the sidewall trace is a metal including Au. In an exemplary metallic trace embodiment, the sidewall trace is a metal including Al. In an exemplary metallic trace embodiment, the sidewall trace is a metal including Cu. The sidewall trace may also include one or more other metals in elemental form or alloyed with each of the aforementioned metals. In some exemplary composite embodiments, the sidewall trace comprises an epoxy resin with a metallic filler. The metallic filler, for example, may further include particles of Ag, Cu, and/or one or more other metals.

In some embodiments, the sidewall trace formed at operation 130 has a width less than 300 µm and a thickness, (e.g., as measured from an underlying interface with the edge sidewall of the IC chip) that is less than 30 µm. Both the sidewall trace width and thickness may vary with the technique employed at operation 130. For example, a sidewall trace formed with an ink printing process may have a width of 10-30 µm, and a thickness of 1-5 µm. A sidewall trace formed with a paste printing process may have a greater width (e.g., 30-300 µm) and/or thickness (e.g., 10-30 µm). Techniques that include laser sintering of the deposited material may achieve even narrower line widths (e.g., <5 µm). Both the sidewall trace width and thickness may also depend on the singulation technique employed at operation 120. For example, where singulation entail pico-second or femto-second laser ablation, which has very low recast and generates smoother chip edge sidewalls, a narrower and/or thinner sidewall trace may adequately maintain electrical continuity and sufficient conductivity as it traverses the chip edge sidewall surface. A wider and/or thicker sidewall trace may be necessary where the singulation technique generates rougher chip edge sidewalls. Sidewall trace length may vary with the application. Generally, the sidewall trace will have a length that is at least equal to a portion of the sidewall thickness of the IC chip. The sidewall trace may then extend from the IC chip edge sidewall over any lateral and/or vertical distance needed to reach the desired location for the second trace terminus.

Following operation 130, methods 101 complete at operation 150 with the output of a resulting sidewall-interconnected IC package assembly. In some embodiments, methods 101 entail iteration of at least operation 130, as denoted in FIG. 1 by the dashed arrow. Operation 130 may, for example, be iterated to form a plurality of sidewall traces contacting a single IC chip. Operation 130 may also be iterated to form at least one sidewall trace contacting at least on edge sidewall of a plurality of chips that may be successively attached into any desired stacked-chip assembly. To further illustrate structures and assembly techniques that comport with methods 101, various illustrative embodiments are further discussed in detail below.

Figure 2:
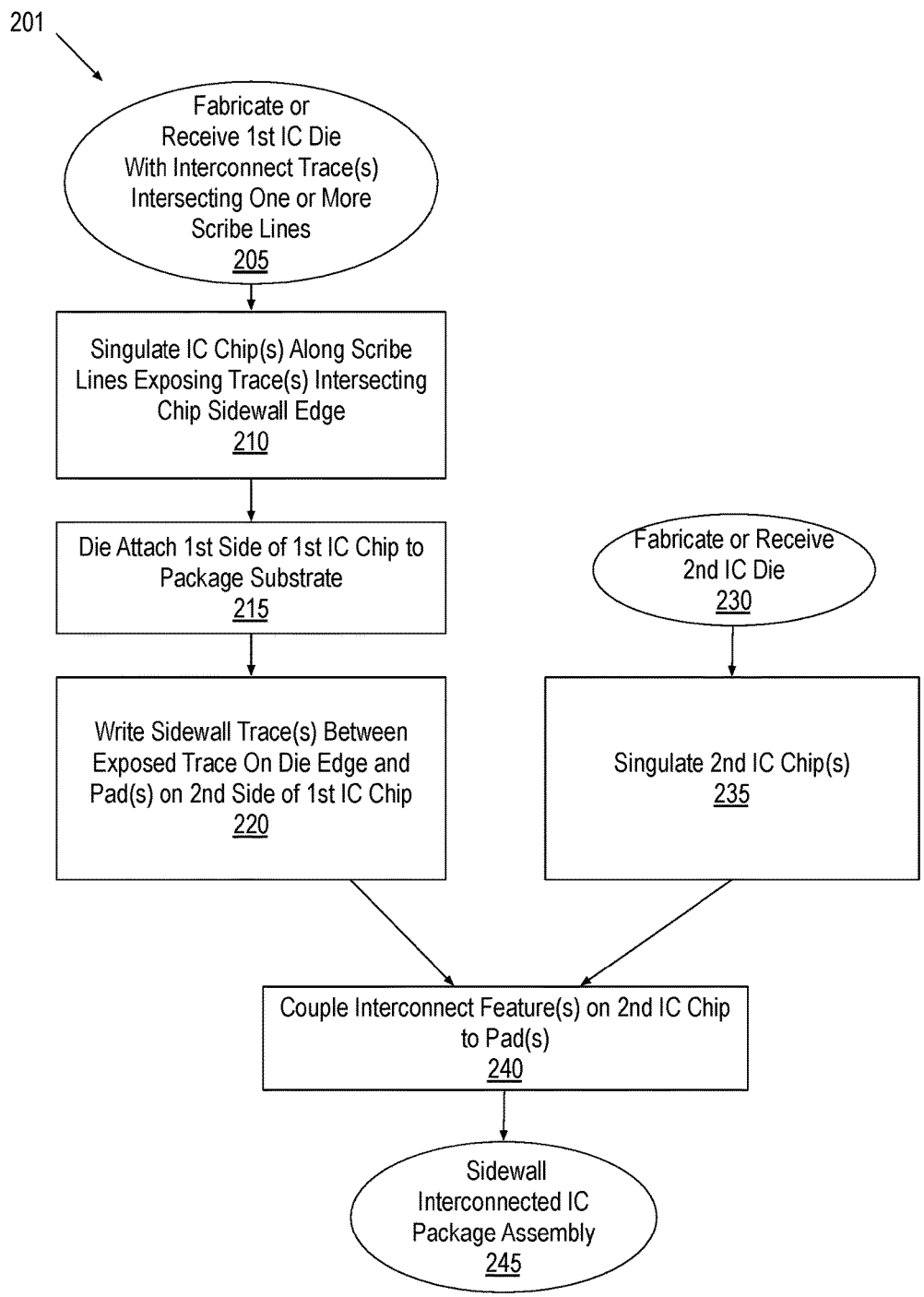
FIG. 2 illustrates a flow diagram of methods for fabricating a chip assembly including a first IC chip interconnected to another IC chip through a sidewall interconnect trace, in accordance with some embodiments.

FIG. 2 illustrates a flow diagram of methods 201 for fabricating a chip assembly that includes a first IC chip interconnected to another IC chip through a sidewall interconnect, in accordance with some embodiments of methods 101. Methods 201 illustrate how a sidewall trace may be extended to a top (or bottom) side of a first IC chip and a second IC chip then attached to that top (or bottom) side of the first IC chip. The sidewall trace may then provide at least some of the electrical interconnection between the first and second IC chips when the package assembly is operated.

Method 201 begins at operation 205 where a first IC die is fabricated or received, for example concurrently with other die arrayed over a fabrication substrate. The first IC die may be any known IC, such as, but not limited to a microprocessor, memory, or SOC including two or more of a memory, processor, RF transceiver, and power management IC. Any microelectronic fabrication process(es) may be employed at operation 205, such as but not limited to, those associated with silicon-based CMOS IC fabrication. During the IC die fabrication process(es), one or more levels of interconnect metallization may be formed, for example to interconnect various active devices (e.g., transistors and/or memory cells) into a functional IC. In some embodiments, the fabrication of at least one of the interconnect metallization levels entails forming a conductive trace within a region of the substrate that is to be fractured, sawed, ablated, scribed, milled or otherwise removed to form a single IC chip from the substrate. Typically, interconnect metallization formed during the fabrication of an IC is routed only within confines of a given die. A guard band comprising a stack of structures formed during successive IC fabrication processes may delineate a perimeter of a single die. This guard band may help limit crack propagation during singulation and/or otherwise provide a protective barrier surrounding the die area. While IC trace routing will typically remain within the guard band, for some embodiments herein at least one trace for at least one level of interconnect metallization intersects a plane substantially perpendicular to a top surface of the die along which the guard band extends. A guard band structure may be made discontinuous to allow one or more interconnect trace to pass beyond the guard band, into a scribe line, lane, or street. Alternatively, a guard band structure may be made to be discontinuous so that a portion of the guard band where one or more interconnect trace intersects is electrically insulated from other portions of the guard band.

Figure 3A:
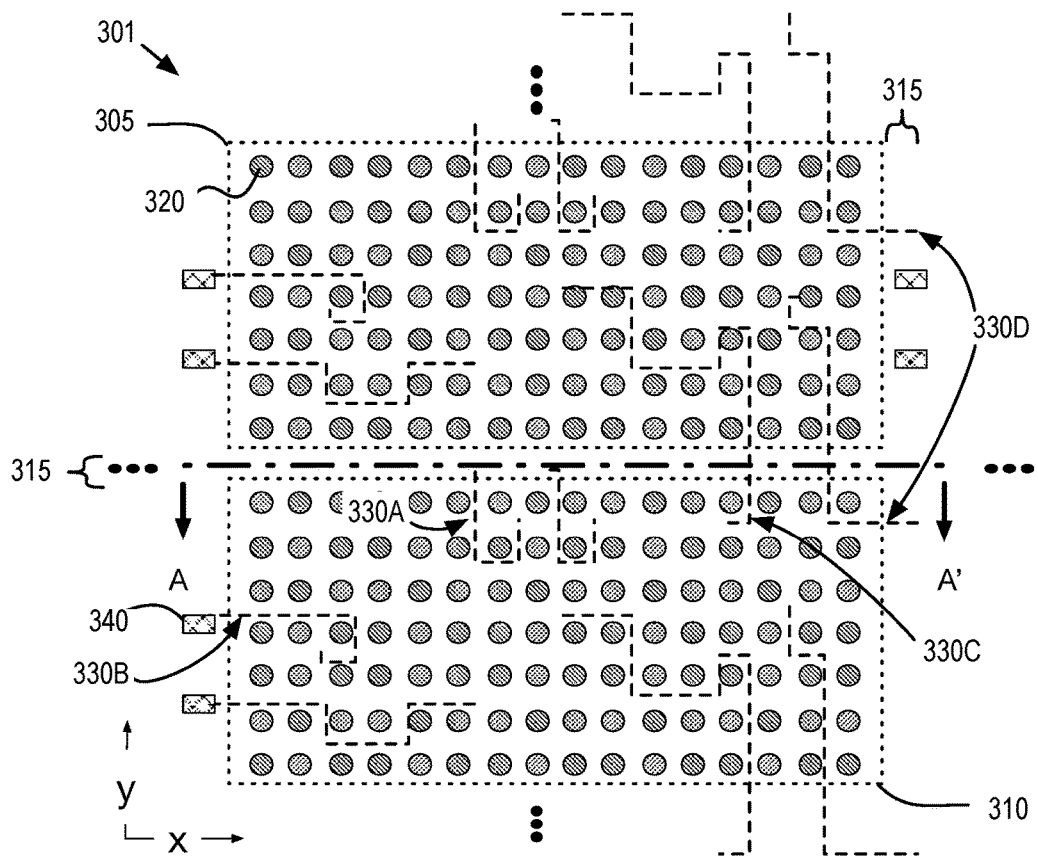
FIG. 3A illustrates a top-down plan view of a first side of an IC chip that is to be flip-chip and sidewall interconnected, in accordance with some embodiments.

FIG. 3A illustrates a top-down plan view of a first side of an IC chip that is to be flip-chip and sidewall interconnected in accordance with some illustrative embodiments of methods 201. In FIG. 3A, a fabrication substrate 301 includes a die 305 adjacent to another die 310. The die perimeters are delineated by dashed line. Along these dashed lines may be a guard band structure, for example. Between die 305 and 310 is a street 315. Various test structures may reside within street 315, or not. As further illustrated, each of die 305, 310 include a plurality of top-level interconnect features 320. Interconnect features 320 may be metal pads, pillars, posts, etc. formed in a top interconnect metallization level (e.g., metal 10). Illustrated in dashed line are various interconnect traces 330A, 330B, 330C and 330D that extend into street 315. While interconnect traces 330A-330D may be in any metallization level (e.g., metal 1-metal 10), in some exemplary embodiments, interconnect traces 330A-330D are in an upper metallization level (e.g., metal 5 or higher), but below the top-level interconnect features 320. Upper metallization levels may have larger lateral trace dimensions (e.g., at least 1 µm) and/or greater trace thicknesses (e.g., at least 1 µm) that can facilitate their subsequent contact with a sidewall trace. As shown for interconnect trace 330A, a trace that is to be exposed by a chip singulation process may simply terminate in street 315. Alternatively, as shown for interconnect trace 330B, a trace may terminate at a conductive street structure 340 that is to be exposed by a chip singulation process. Street structure 340 may, for example be fabricated as part of a guard band or as a test structure might otherwise be fabricated within street 315 during die fabrication. Street structure 340 may have any dimensions (e.g., many micrometers laterally and/or thickness) to occupy a large cross-section of street 315 that can be readily contacted after their exposure by the singulation process. In some embodiments, as illustrated for interconnect trace 330C, a trace that is to be bifurcated by the die singulation process may extend between adjacent die, completely spanning an intervening street 315. For such embodiments, each end of the bifurcated trace exposed by a singulation process may be subsequently contacted by separate sidewall traces. In some further embodiments, as illustrated for interconnect trace 330D, a trace may intersect more than one die edge and/or cross more than one street 315.

Figure 3B:
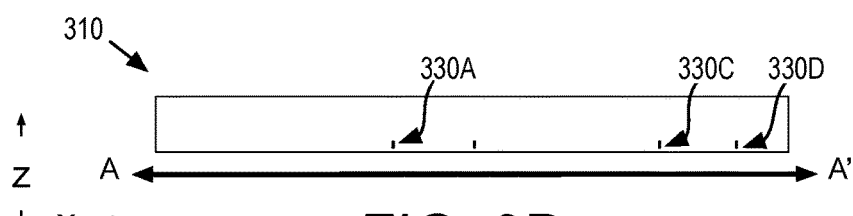
FIGS. 3B, 3C, and 3D illustrate a sidewall of the IC chip illustrated in FIG. 3A, in accordance with some embodiments.

Returning to FIG. 2, methods 201 continue at operation 210 where the IC die fabricated at operation 205 are singulated along the streets between adjacent die to form discrete IC chips. Singulation may be by any known process, such as, but not limited to, one or more of mechanical scribe, fracture, break, laser ablation, or saw. Following singulation, at least one interconnect trace is exposed on at least one edge sidewall of a singulated IC chip. For example, FIG. 3B illustrates a sidewall of the IC chip 310 after singulation along the dot-dashed A-A' line depicted in FIG. 3A. In the cross-sectional view along the singulation line, exposed cross-sections of interconnect traces 330A, 330C, and 330D are depicted. Had any of the traces 330A, 330C, and 330D traversed a distance parallel to the singulation line A-A', an edge of the traces larger than the trace cross-sections might be similarly exposed. Although traces 330A, 330C, and 330D are all illustrated as being on a same interconnect metallization level (e.g., level 8), the exposed traces may be on different metallization levels. Furthermore, where stacked vias are permitted, an exposed portion of the interconnect trace may comprise more than one interconnect metallization level.

Figure 3C:
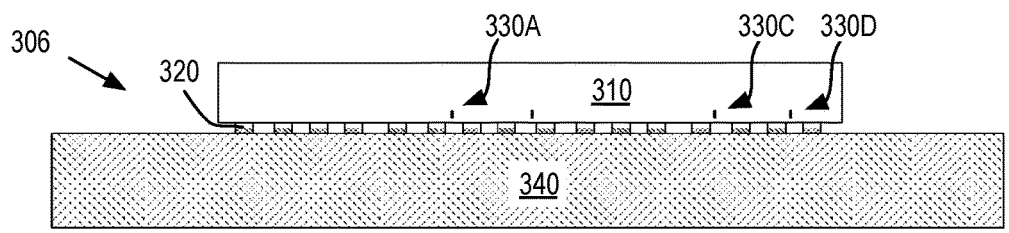

Returning to FIG. 2, methods 201 continue at operation 215 where the first side of the singulated IC chip is attached to a package substrate. Any die attach technique and any package substrate may be employed at operation 215. In some embodiments, a flip-chip process is employed to bond a plurality of conductive interconnect features to a corresponding set of interconnect features of the substrate. FIG. 3C illustrates a sidewall of the IC chip 310 parallel to the singulation line A-A' following die-attach operation 215 in accordance with some flip-chip embodiments. As illustrated, top-level interconnect features 320 are electrically coupled (e.g., bonded) to corresponding features of substrate 340 to form a package sub-assembly 306. Upon die-attachment, interconnect traces 330A, 330C, and 330D remain exposed along the IC chip edge sidewall, but are otherwise embedded and not yet electrically coupled to any source/sink terminal.

Figure 3D:
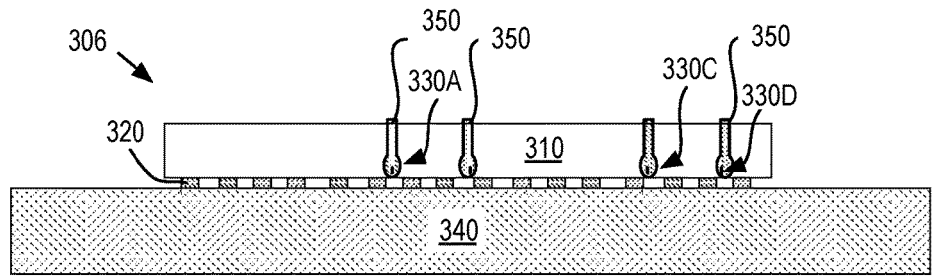

Returning to FIG. 2, methods 201 continue at operation 220 where a sidewall trace is written between a first terminus contacting the interconnect trace end exposed on the edge sidewall of the first IC chip, and a second terminus located on a second side of the first IC chip. Operation 220 may entail any point-to-point interconnection technique suitable for contacting the interconnect trace end exposed on the edge sidewall of the first IC chip. In some embodiments, one or more of the sidewall trace fabrication technique described above in the context of operation 130 (FIG. 1) is performed at operation 220. FIG. 3D further illustrates an exemplary embodiment where sidewall traces 350 have been printed on IC chip 310. As shown, a first end of one sidewall trace 350 contacts interconnect trace 330D, and further traverses a partial thickness of IC chip 310, and wraps around the exposed (bottom) side of IC 310, opposite substrate 340. As further shown in the plan view of FIG. 3E, a plurality of traces 350 extend from a plurality of corresponding interconnect traces exposed on the IC chip edge sidewalls (e.g., traces 330A-330D), and terminate with bottom-side pads 355. Bottom side pads may, for example, be printed as part of the sidewall traces 350. Although in the illustrated embodiment sidewall traces 350 are written after fabrication of sub-assembly 306, sidewall traces 350 may alternatively be formed prior to attaching die 310 to substrate 340 since sidewall traces 350 terminate on IC chip 310.

Figure 3E:
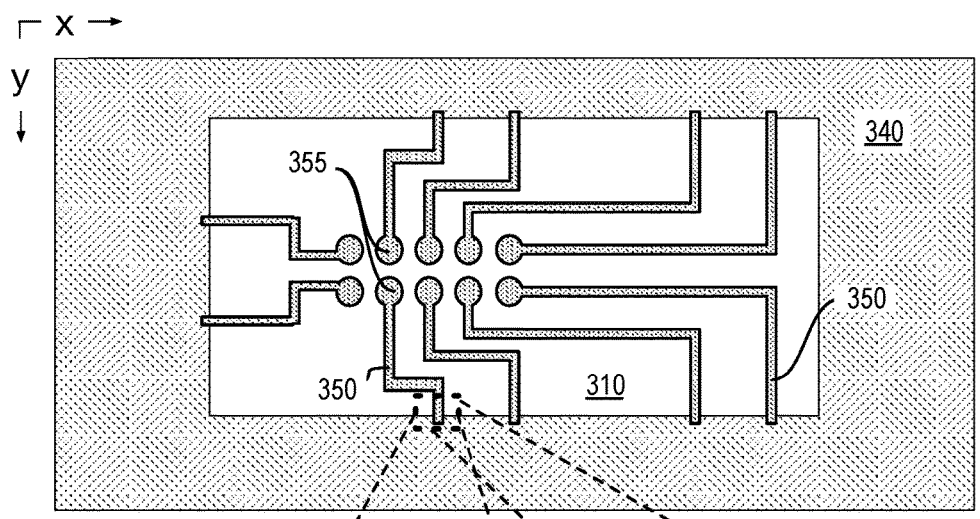
FIG. 3E illustrates a top-down plan view of a second side of the IC chip that is to be flip-chip and sidewall interconnected, in accordance with some embodiments.
Figures 3F, 3G:
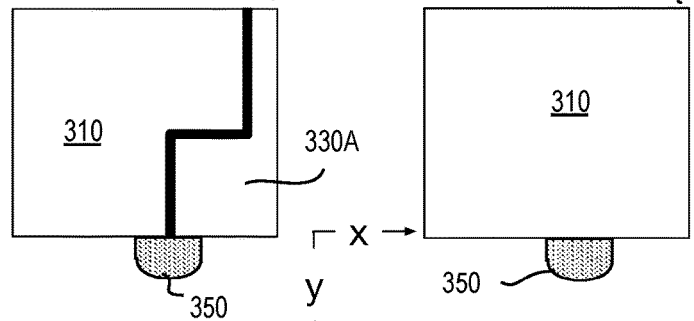
FIGS. 3F and 3G illustrate plan views through sections of the IC chip and a sidewall interconnect, in accordance with some embodiments.

FIGS. 3F and 3G illustrate plan views through sections of the IC chip and a sidewall interconnect, in accordance with some embodiments. FIGS. 3F and 3G depict what might be seen as the structure illustrated in FIG. 3E is polished down to reveal the intersection of sidewall trace 350 and interconnect trace 330A, for example. In FIG. 3F, the cross-section passes through at a z-height at which interconnect trace 330A makes a lateral run that intersects a chip edge. Sidewall trace 350 at least partially overlaps interconnect trace 330A, with any additional lateral width of sidewall trace 350 contact other (e.g., dielectric materials) making up the chip edge. FIG. 3G illustrates sidewall trace 350 on the chip sidewall at another z-height that does not intersect interconnect trace 330A.

Returning to FIG. 2, methods 201 continue with the receiving or fabricating a second IC die at operation 230 followed by singulation at operation 235. The second IC die may be functionally the same as that of the first IC die fabricated at operation 205 (e.g., both chips being processors or both chips being memory ICs), or may be functionally different (e.g., the first being a processor and the second being a memory IC). Singulation operation 235 may again entail any known process (e.g., scribe, and/or ablation, and/or break, and/or saw, etc.). Singulation operation 235 may employ the same or different singulation process(es) as operation 210. At operation 240, the second IC chip is electrically coupled to the sidewall trace terminals on the bottom side of the first IC chip. Electrical coupling of the chips may entail any die attachment process. Methods 201 then complete at operation 245 with the output of a sidewall-interconnected IC package assembly. In some embodiments, operation 240 comprises thermo-compression bonding of conductive interconnect features on the second IC chip to corresponding termini of the sidewall traces printed on the first IC chip.

Figure 3H:
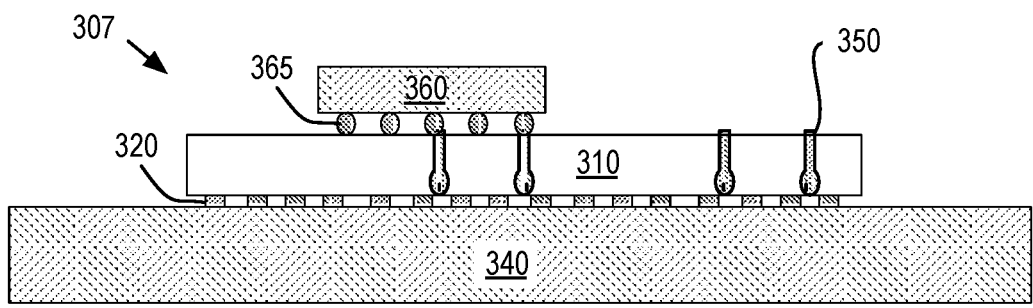
FIG. 3H illustrates a side view of a multi-chip assembly including an IC chip interconnected to another IC chip through a sidewall interconnect trace, in accordance with some embodiments.

FIG. 3H illustrates a side view of a multi-chip assembly 307 including IC chip 310 interconnected through pads 355 to features 365 located on a top side of IC chip 360, in accordance with some embodiments. In other words, IC chip 360 is flip-chip bonded to terminals provided by the sidewall traces. In some such embodiments, at least one of IC chip 310 and 360 is a memory chip, such as a DRAM or flash NAND chip. In some further embodiments, at least one of IC chip 310 and 360 is a microprocessor chip or SOC.

Figure 4:
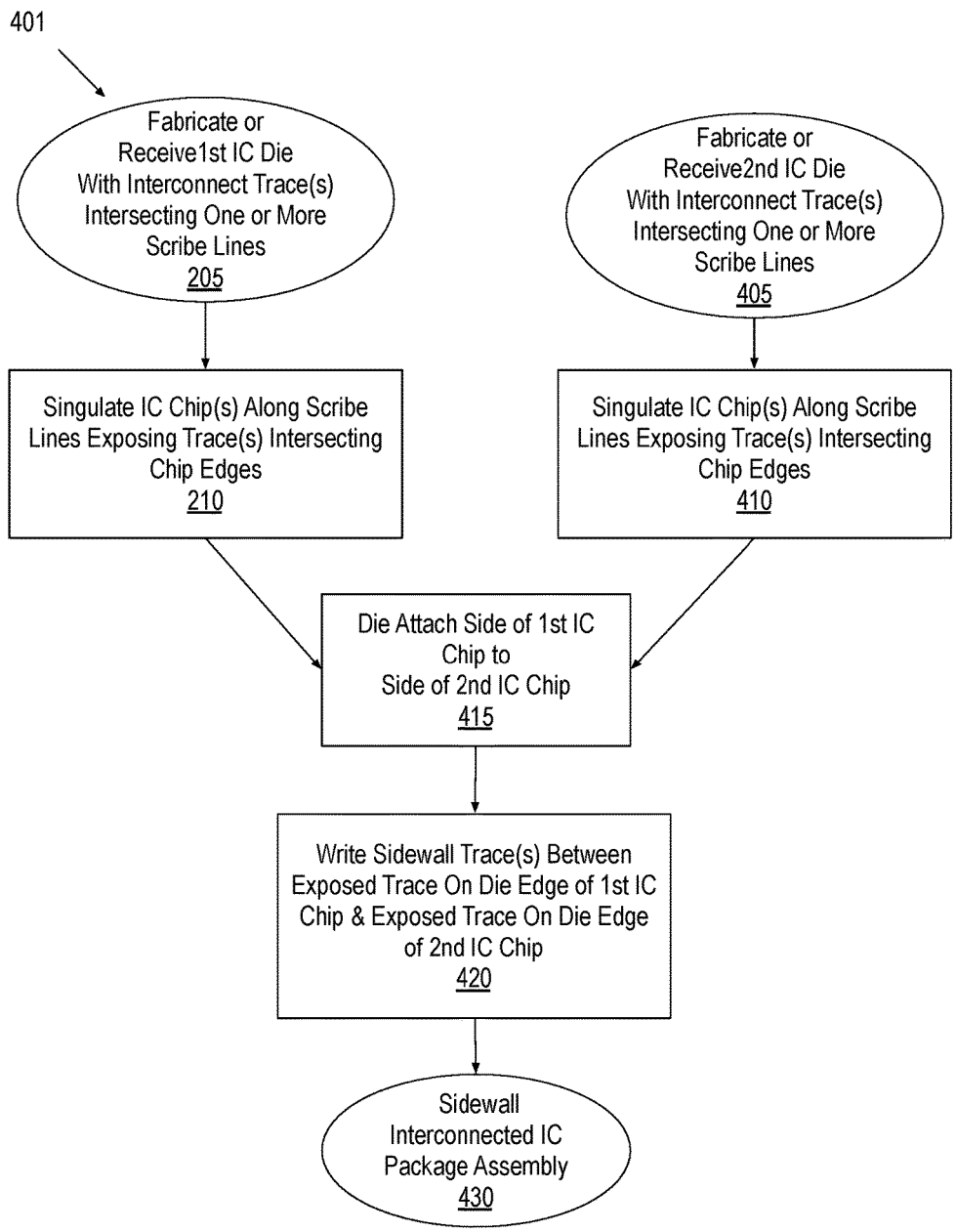
FIG. 4 illustrates a flow diagram of methods for fabricating a chip assembly including a first IC chip interconnected to another IC chip through a sidewall interconnect trace, in accordance with some embodiments.
Figure 5A:
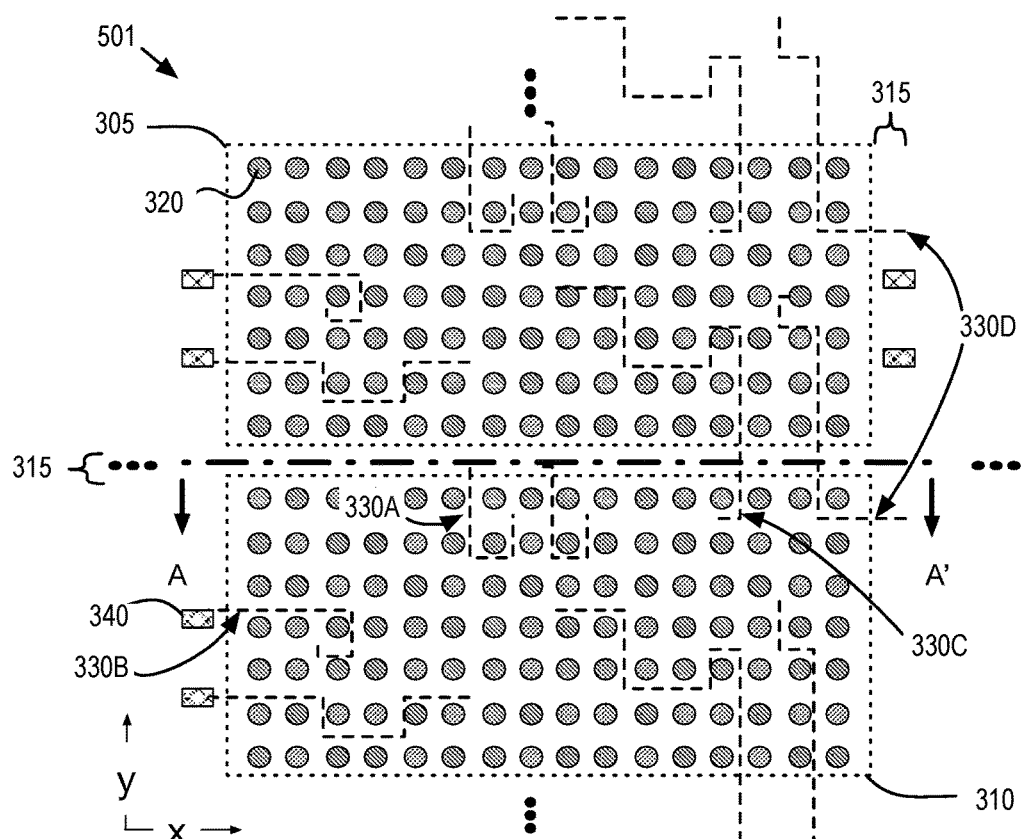
FIG. 5A illustrates a top-down plan view of a first side of an IC chip that is to be flip-chip and sidewall interconnected, in accordance with some embodiments.
Figure 5B:
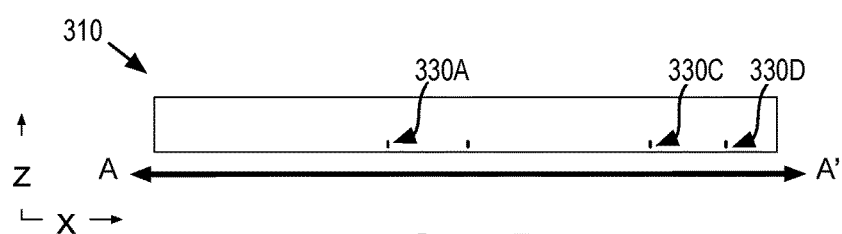
FIG. 5B illustrates a sidewall of the IC chip illustrated in FIG. 5A, in accordance with some embodiments.

In some embodiments, two or more stacked IC chips are electrically coupled by sidewall traces that contact at least one interconnect trace end exposed at the edge sidewall of one or more of the chips. For some advantageous embodiments, the sidewall traces make sidewall contacts to more than one of the chips in a stack. FIG. 4 illustrates a flow diagram of methods 401 for fabricating a chip assembly including a first IC chip interconnected to another IC chip through a sidewall interconnect trace, in accordance with some embodiments of methods 101. In methods 401, operations 205 and 210 may be substantially as described above in the context of methods 201. Upon completion of operation 210, a singulated IC chip includes one or more interconnect trace, at one or more interconnect metallization level, exposed at an edge sidewall of the IC chip. FIG. 5A, for example, illustrates a top-down plan view of a first side of an IC chip that is to be flip-chip and sidewall interconnected, in accordance with some embodiments. As shown in FIG. 5A, a die fabrication substrate 501 includes die 305 and 310 separated by intervening street 315. Interconnect traces 330A-330D are substantially as described above for any of the embodiments illustrated in FIG. 3A. FIG. 5B illustrates a sidewall of IC chip 310 upon singulation from substrate 501.

Figure 5C:
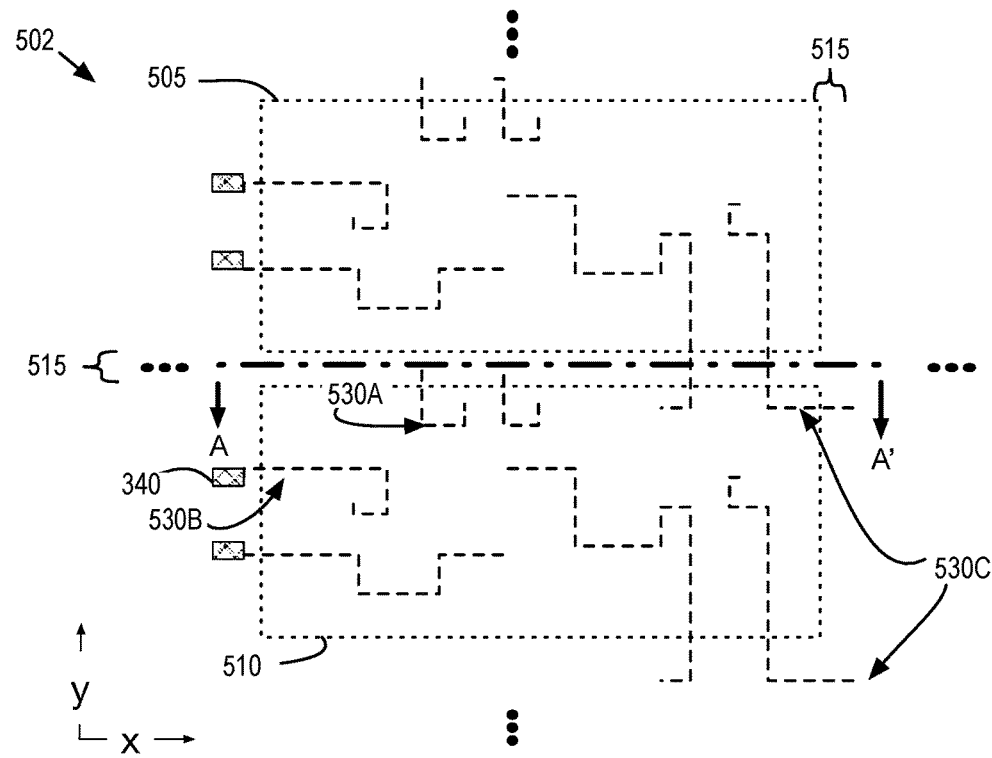
FIG. 5C illustrates a top-down plan view of a first side of an IC chip that is to be sidewall-interconnected, in accordance with some embodiments.
Figure 5D:
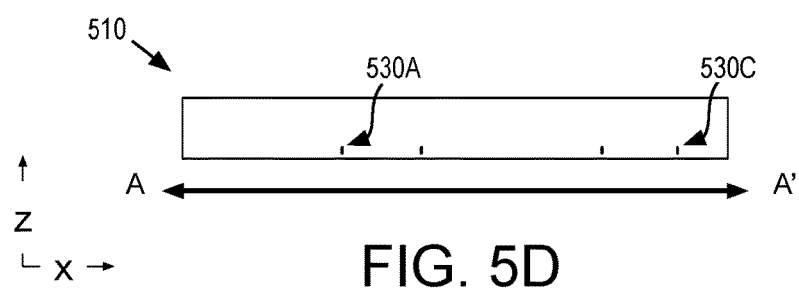
FIG. 5D illustrates a sidewall of the IC chip illustrated in FIG. 5C, in accordance with some embodiments.

Returning to FIG. 4, methods 401 continue with fabricating or receiving a second IC die at operation 405. The second die may also include at least one interconnect trace intersecting one or more scribe lines or streets beyond an edge of the die, for example in substantially the same manner as the first die at operation 205. In some embodiments, operations 205 and 405 are performed concurrently with the first and second chips being from the same die fabrication substrate. In other embodiments, operations 205 and 405 are performed on separate fabrication substrates with the two die being functionally distinct ICs. At operation 410, the second die is singulated from its substrate using any known technique. The singulation process exposes any trace(s) that intersects the chip edge(s). In FIG. 5C, die fabrication substrate 502 includes a die 505 adjacent to another die 510 and separated by street 515. As shown, interconnect traces 530A-530C may terminate in the street 515, pass completely through street 515, or terminate at street structure 340, substantially as described elsewhere herein. FIG. 5D illustrates a sidewall of IC chip 510 following singulation along the A-A' singulation line, in accordance with some embodiments.

Returning to FIG. 4, methods 401 continue at operation 415 where the two IC chips are attached to one another using any known technique to bond, join, or otherwise affix a side (e.g., top or bottom) of the first IC chip to a side (e.g., top or bottom) of the second IC chip. At operation 420, a sidewall interconnect trace is written between one trace exposed at an edge sidewall of a first IC chip and another trace exposed at an edge sidewall of a second ID chip. Any of the sidewall trace formation techniques described elsewhere herein (e.g., for operation 130) may be performed at operation 420. Methods 401 then complete at operation 430 with the output of a sidewall-interconnected IC assembly.

Figure 5E:
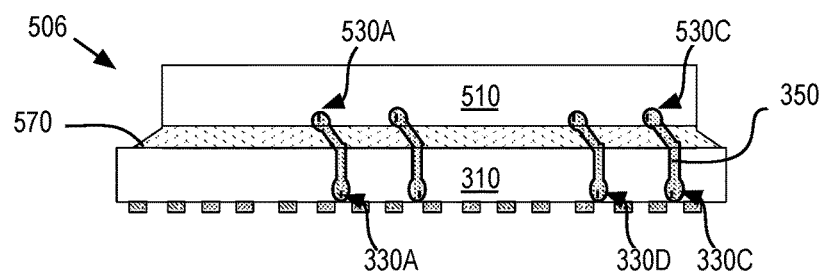
FIG. 5E illustrates a side view of a multi-chip assembly including an IC chip interconnected to another IC chip through a sidewall interconnect trace, in accordance with some embodiments.

FIG. 5E illustrates a side view of a multi-chip assembly 506 including IC chip 310 interconnected to IC chip 510 through sidewall interconnect traces 350, in accordance with some exemplary embodiments. As shown, a first end of each sidewall trace 350 contacts an interconnect trace 330A-330C associated with IC chip 310. A second end of each sidewall trace 350 contacts a corresponding interconnect trace 530A-530C associated with IC chip 510. In this illustrative embodiment, chips 310 and 510 are physically joined by a die-attach paste (DAP) or die-attach film (DAF) 570. The die-attach material may be employed to adhere IC chips together as stacked-chip assembly 506 is fabricated. DAP/DAF 570 may be any material known in the art to be suitable for die-to-die bonding, such as, but not limited to, an epoxy. DAP/DAF 570 advantageously provides a suitable surface to support sidewall interconnect trace 350 as it traverses the joint between IC chips 305, 510. In some embodiments, after DAP/DAF 570 is cured, sidewall traces 350 are printed onto assembly 506.

Figure 6:
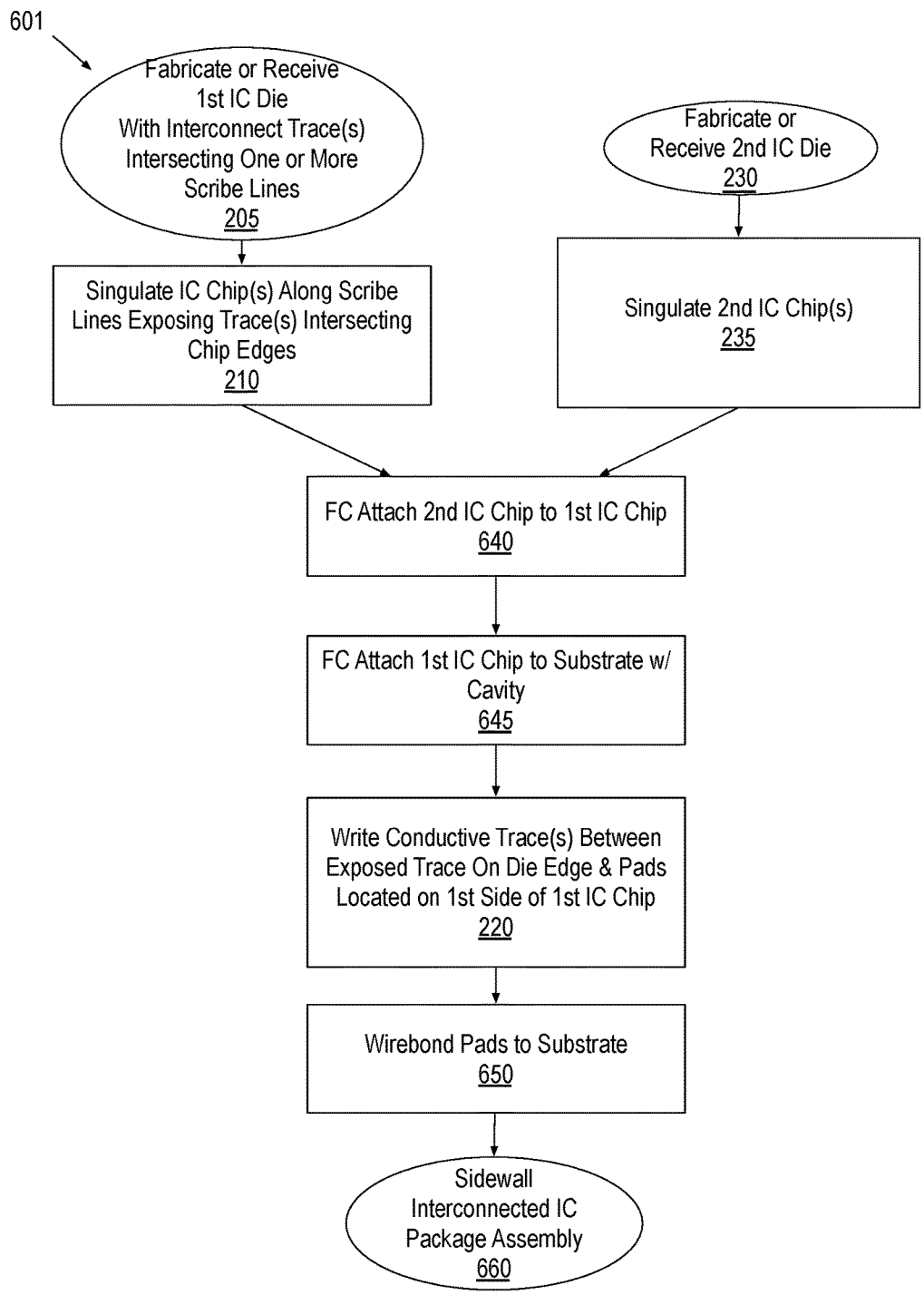
FIG. 6 illustrates a flow diagram of methods for fabricating a chip assembly including a first IC chip interconnected to another IC chip through a sidewall interconnect trace, in accordance with some embodiments.

Sidewall interconnect traces may also be employed with chips electrically interconnected face-to-face. For such embodiments, the sidewall interconnect may further provide electrical interconnects to a package substrate, as one example. These additional interconnects may advantageously reduce the footprint of the IC chips by enabling electrical interconnect through a second side of a chip stack. FIG. 6 illustrates a flow diagram of methods 601 for fabricating a chip assembly including a first IC chip interconnected to another IC chip through a sidewall interconnect, in accordance with some exemplary embodiments of methods 101. In methods 601, operations 205 and 210 may be performed substantially as described above in the context of methods 201. Upon completion of operation 210, a singulated IC chip includes one or more interconnect trace, at one or more interconnect metallization level, exposed at an edge sidewall of the IC chip.

Figure 7A:
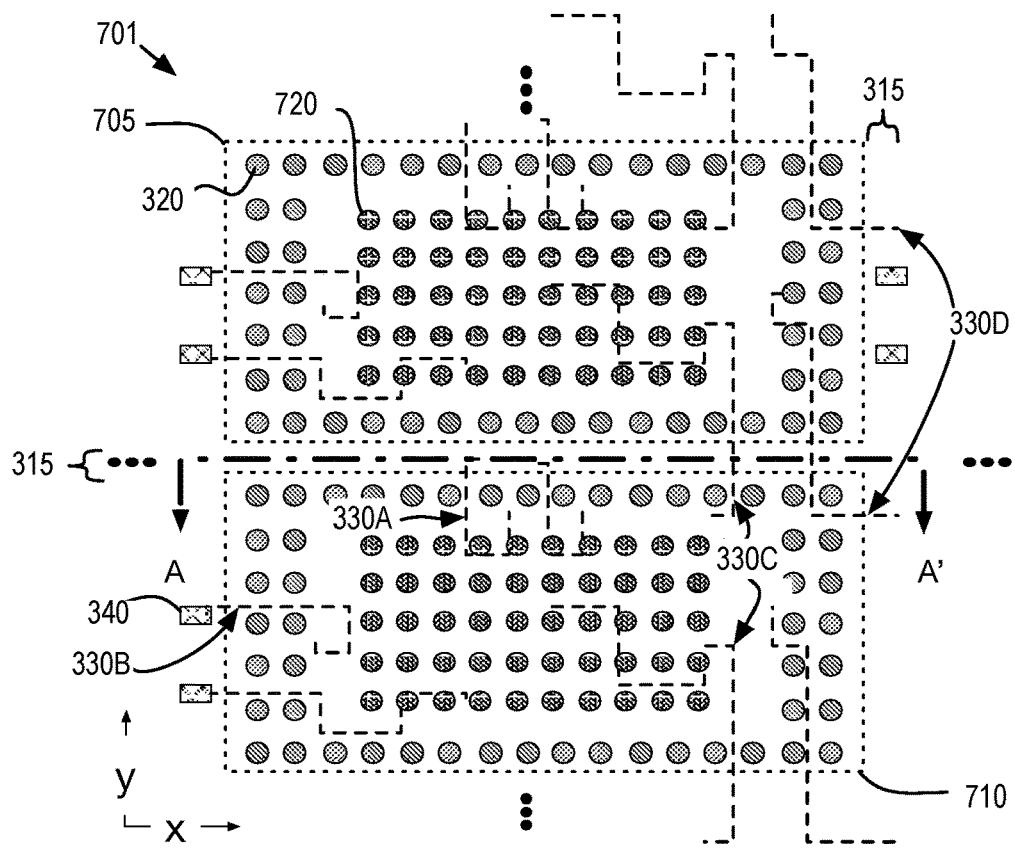
FIG. 7A illustrates a top-down plan view of a first side of an IC chip that is to be flip-chip and sidewall interconnected, in accordance with some embodiments.
Figure 7B:
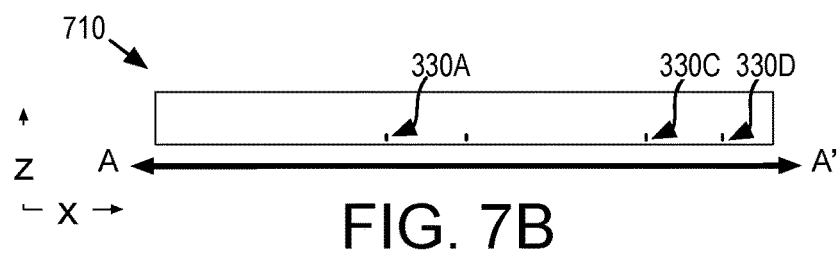
FIG. 7B illustrates a sidewall of the IC chip illustrated in FIG. 7A, in accordance with some embodiments.

FIG. 7A, for example, illustrates a top-down plan view of a first side of an IC chip that is to be flip-chip and sidewall interconnected, in accordance with some embodiments of methods 601. As shown in FIG. 7A, die fabrication substrate 701 includes a die 705 and a die 710 separated by intervening street 315. In this embodiment, a top metallization level includes conductive interconnect features 320 and also conductive interconnect features 720. Interconnect features 320 may be dimensionally different (e.g., larger) that interconnect features 720 and/or have a different (e.g., larger) feature pitch suitable for a package substrate while interconnect features 720 are suitable for attaching another die. Interconnect traces 330A-330D may be substantially as described above, for example in the context of FIG. 3A. FIG. 7B illustrates a sidewall of IC chip 710 upon singulation from substrate 701 along the A-A' singulation line.

Returning to FIG. 6, methods 601 continue through operations 230 and 235 where a second IC die is fabricated or received at operation 230, and is then singulated from the fabrication substrate into a second IC chip at operation 235. The second IC chip may be functionally the same as that of the first IC chip singulated at operation 210 (e.g., both chips are processor chips or both chips are memory chips), or may be functionally different (e.g., one is a memory chip while the other is a processor chip). The second IC chip includes conductive interconnect features (e.g., pads, posts, bumps, etc.) corresponding to at least some of the interconnect features present on the first IC chip. At operation 640, one or more of the second IC chips are die attached (e.g., flip-chip attached) to a side of the first IC chip that has mating interconnect features. Electrical coupling of the chips may entail any die attachment process. In some embodiments, operation 640 comprises thermo-compression bonding of conductive interconnect features of the second IC chip to corresponding interconnect features on a side of the first IC chip. The joined chips are then die-attached using any suitable die attachment method (e.g., by flip-chip attaching the first IC chip to a package substrate). Prior to, or subsequent to, joining the first and second IC chips and/or attachment to the package substrate, sidewall traces are formed on the first IC chip at operation 220. These sidewall traces may provide a routing path to a location elsewhere on the first IC chip (e.g., back side), or to a location off-chip (e.g., to second IC chip or a package substrate). The sidewall trace routing may be performed using any suitable technique, such as, but not limited to, those techniques described elsewhere herein in the context of operation 130. In some exemplary embodiments, methods 601 continue at operation 650 where wire bonds are formed between the sidewall traces and the package substrate. Methods 601 are then complete at operation 660 where the resulting sidewall-interconnected IC assembly is output.

Figure 7C:
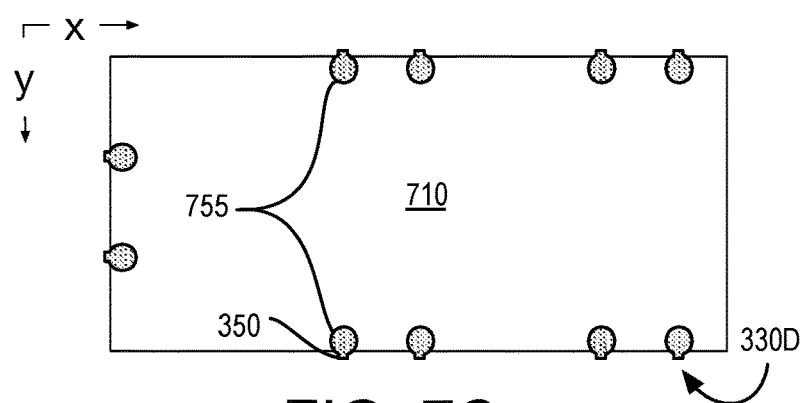
FIG. 7C illustrates a top-down plan view of a second side of an IC chip that is to be flip-chip and sidewall interconnected, in accordance with some embodiments.
Figure 7D:
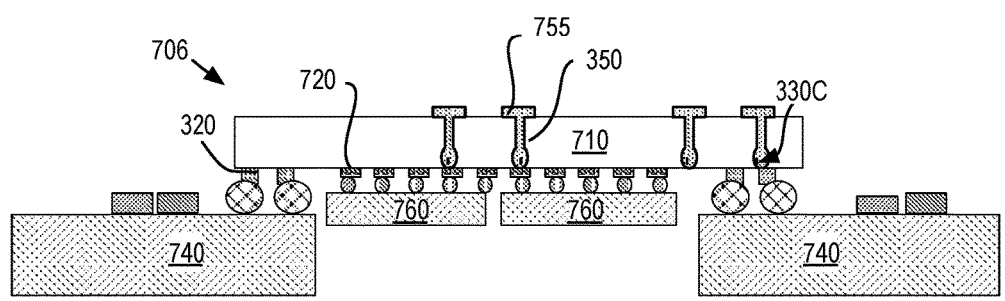
FIGS. 7D and 7E illustrate side views of a multi-chip assembly including an IC chip electrically coupled to another IC chip through a sidewall interconnect trace, in accordance with some embodiments.
Figure 7E:
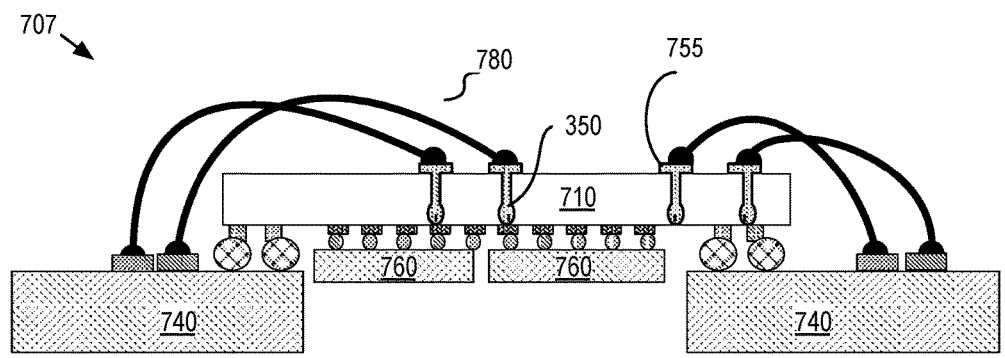

FIG. 7C illustrates a top-down plan view of a second side IC chip 710 following printing of sidewall interconnect traces 350 between corresponding edge-exposed interconnect traces (e.g., trace 330D) and lands 755 printed on the chip back-side surface during the sidewall trace printing operation. Such printing may be performed after a second die is attached to the opposite side of IC chip 710 and/or after IC chip 710 is attached to a package substrate. FIG. 7D illustrates a side view of a multi-chip sub-assembly 706 including two IC chips 760 flip-chip attached to interconnect features 720 arrayed over a first side of IC chip 710. IC chip 710 is further flip-chip attached to substrate 740 through interconnect features 320, also arrayed over the first side of IC chip 710. Substrate 740 may include a relief to accommodate IC chips 760. Sidewall interconnect traces 350 route various sidewall-exposed interconnect traces from the edge of IC chip 710 to printed lands 755. FIG. 7E further illustrates side view of a multi-chip assembly 707 after any known wire bonding technique is performed on sub-assembly 706. As shown, wire bonds 780 extend between the sidewall interconnect traces 350 (e.g., printed lands 755) and corresponding lands on substrate 740.

Sidewall interconnect traces may also be employed with multiple chips in a stack to provide interconnection routes for each of the chips. For such embodiments, a sidewall interconnect trace may further provide electrical interconnects to a package substrate or between various chips in the stack. These additional interconnects may advantageously reduce the footprint of the IC chips by enabling electrical interconnect through a second side of each chip in a chip stack. In some exemplary embodiments, the sidewall interconnect traces may provide additional lands suitable for wire bonding to the various chips in a stack.

Figure 8:
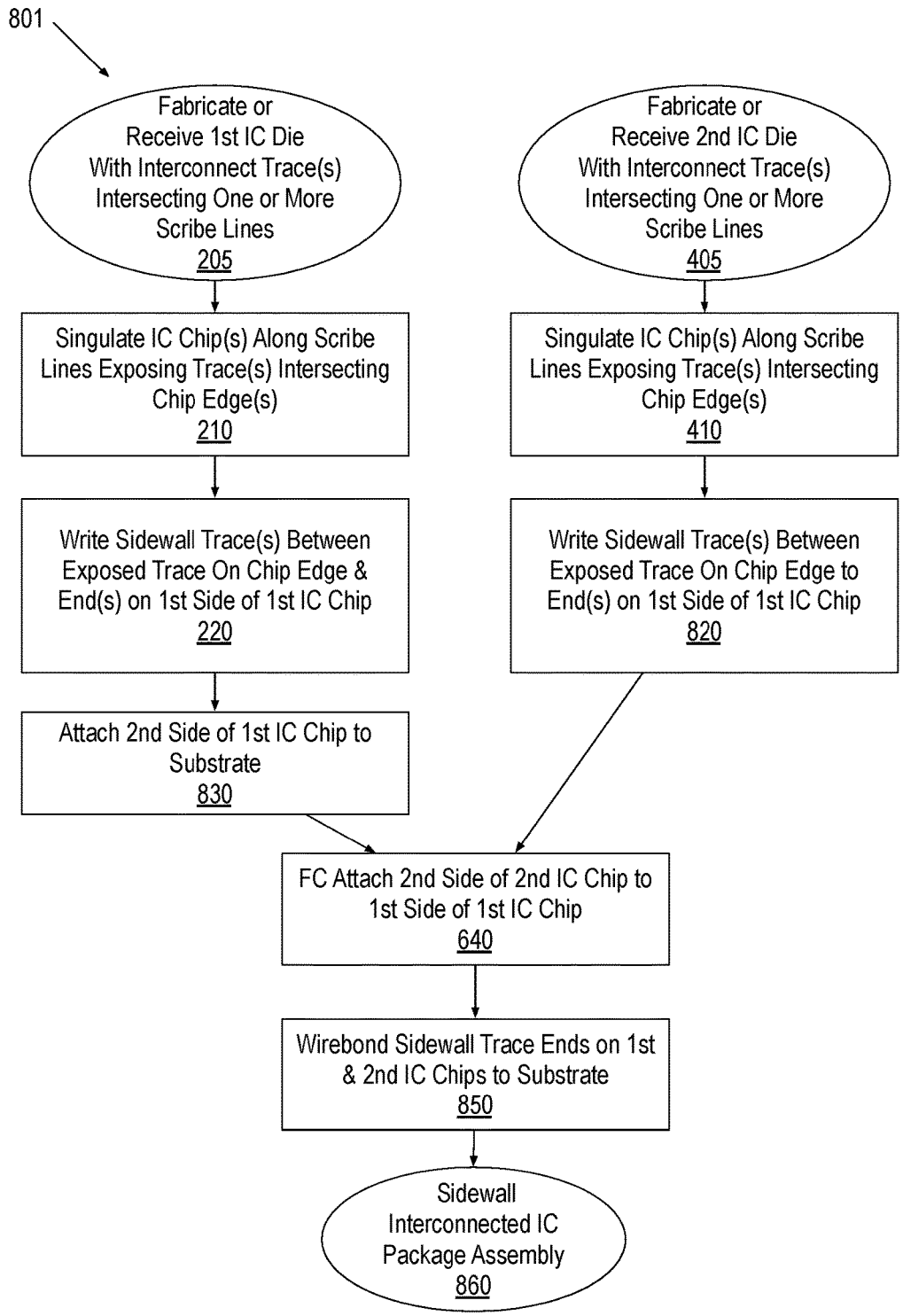
FIG. 8 illustrates a flow diagram of methods for fabricating a chip assembly including a first IC chip interconnected to another IC chip through a sidewall interconnect trace, in accordance with some embodiments.
Figure 9A:
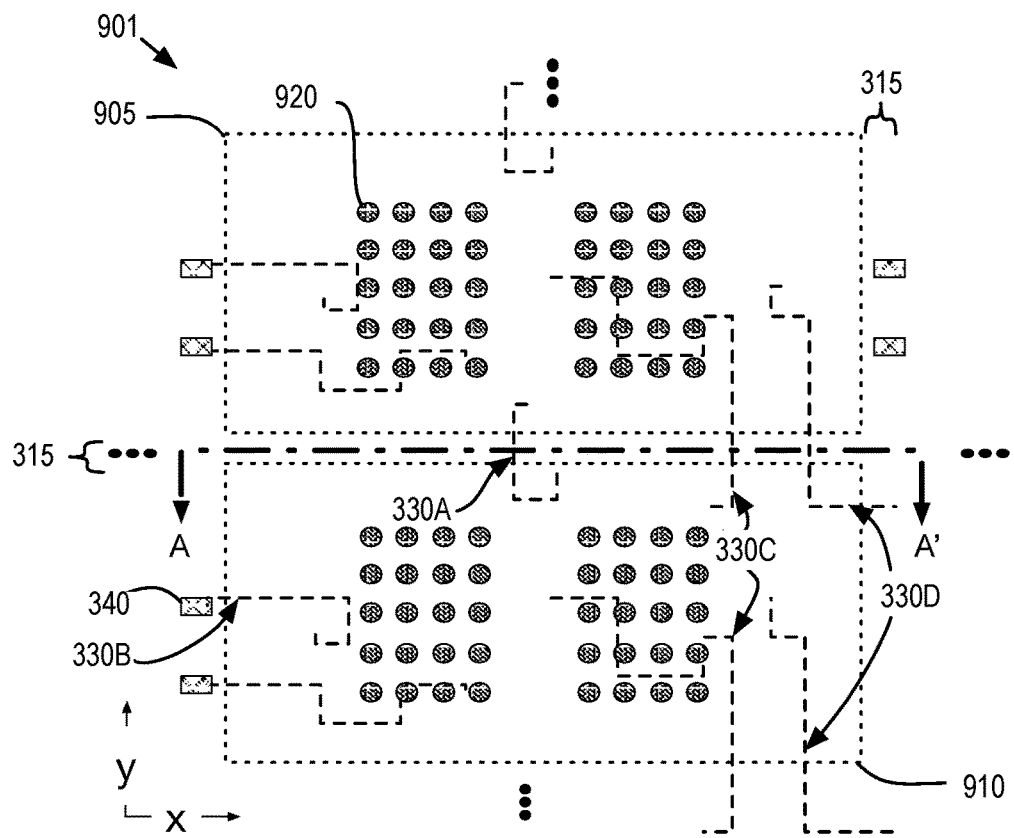
FIG. 9A illustrates a top-down plan view of a first side of an IC chip that is to be wire bonded and sidewall interconnected, in accordance with some embodiments.
Figure 9B:
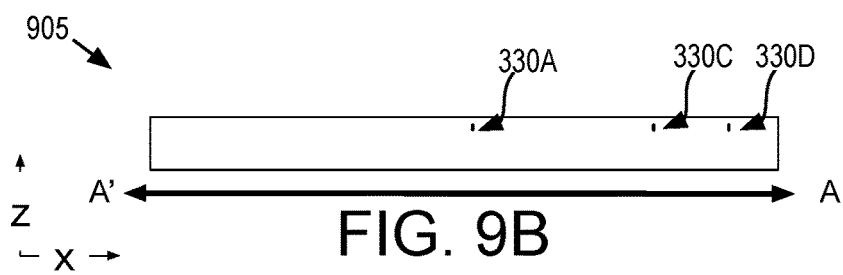
FIG. 9B illustrates a sidewall of the IC chip illustrated in FIG. 9A, in accordance with some embodiments.

FIG. 8 illustrates a flow diagram of methods 801 for fabricating a chip assembly including a multi-chip stack employing a plurality of sidewall interconnect traces, in accordance with some embodiments of methods 101. Methods 801 include operation 205 where a first IC die is fabricated or received, for example substantially as described elsewhere herein. At operation 210, the first IC die is singulated from the fabrication substrate to generate a first IC chip having at least one interconnect trace intersecting the chip edge. FIG. 9A, for example, illustrates a top-down plan view of a first side of an IC chip that is to be sidewall interconnected, in accordance with some embodiments of methods 801. As shown in FIG. 9A, fabrication substrate 901 includes a die 905 and a die 910 separated by intervening street 315. In this embodiment, a top metallization level includes conductive interconnect features 920 suitable for attaching to another die or package substrate. Interconnect traces 330A-330D may be substantially as described above for any of the embodiments illustrated in FIG. 3A. FIG. 9B illustrates a sidewall of IC chip 905 upon singulation from substrate 901 along the A-A' singulation line.

Figure 9C:
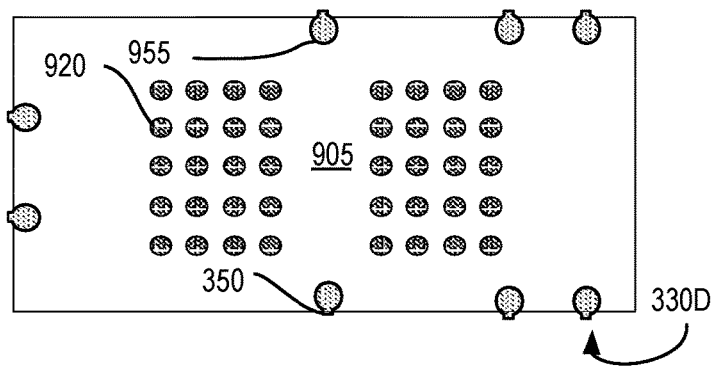
FIG. 9C illustrates a top-down plan view of the first side of IC chip illustrated in FIG. 9A following formation of sidewall interconnect traces, in accordance with some embodiments.
Figure 9D:
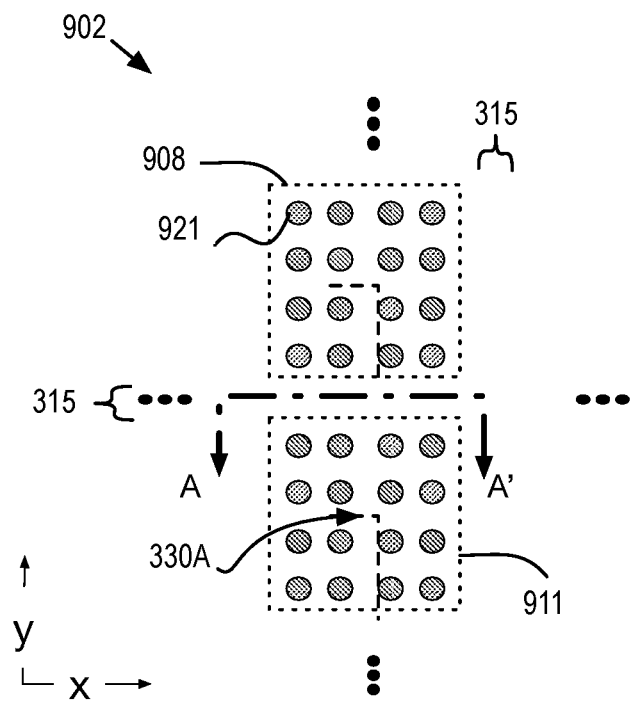
FIG. 9D illustrates a top-down plan view of a first side of an IC chip that is to be flip-chip and sidewall interconnected, in accordance with some embodiments.
Figure 9E:
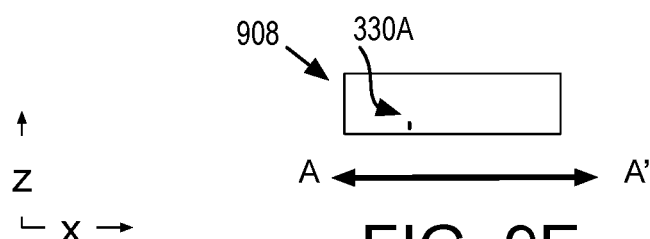
FIG. 9E illustrates a sidewall of the IC chip illustrated in FIG. 9D, in accordance with some embodiments.

Returning to FIG. 8, methods 801 include operation 405 where a second IC die is fabricated or received, for example substantially as described elsewhere herein. At operation 410, the second IC die is singulated from the fabrication substrate to generate a second IC chip having at least one interconnect trace intersecting the chip edge. The first and second IC chips may be functionally and/or dimensionally the same, or may be different. FIG. 9D, for example, illustrates a top-down plan view of a first side of an IC chip that is to be sidewall interconnected, in accordance with some embodiments of methods 801. As shown in FIG. 9D, fabrication substrate 902 includes a die 908 and a die 911 separated by intervening street 315. In this embodiment, a top metallization level includes conductive interconnect features 921 suitable for attaching to another die or package substrate. Interconnect trace 330A may be substantially as described above for any of the sidewall trace embodiments illustrated in FIG. 3A. FIG. 9E illustrates a sidewall of IC chip 908 upon singulation from substrate 902 along the A-A' singulation line.

Figure 9F:
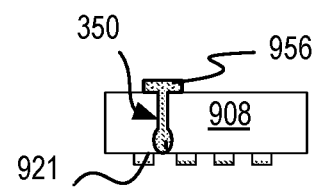
FIG. 9F illustrates a sidewall view of the first side of IC chip illustrated in FIG. 9E following formation of sidewall interconnect traces, in accordance with some embodiments.

Returning to FIG. 8, methods 801 continue with the formation of conductive sidewall traces at operations 220 and 820. The sidewall traces may be formed between the exposed trace on the edge of the first and second IC chips, respectively, and another location on each chip (e.g., a bottom side or top side of the chip). Operations 220 and 820 may entail any of the trace formation techniques described above, for example in the context of operation 130 (FIG. 1). In some exemplary embodiments, conductive sidewall traces are printed with an ink, paste, or powder, that is subsequently cure and/or sintered. FIG. 9C illustrates a top-down plan view of a first side of IC chip 905 following formation of sidewall interconnect traces 350, in accordance with some embodiments. As shown, sidewall interconnect traces 350 terminate at lands 955, which are on the same side of IC chip 905 as interconnect features 920. FIG. 9F illustrates a side view of IC chip 908 following formation of sidewall interconnect traces 350, in accordance with some embodiments. As shown, sidewall interconnect traces 350 terminate at lands 956, which are on an opposite side of IC chip 908 as interconnect features 921.

With the sidewall traces present on the IC chips, they may be attached to each other, and/or attached to a third IC chip, and/or attached to a package substrate. Alternatively, some or all die attachment operations may be performed prior to forming the sidewall traces. In the exemplary embodiment illustrated in FIG. 8, methods 801 proceed to operation 830 where a side of the first IC chip is attached to a package substrate at operation 830. This attachment may either be purely mechanical (e.g., with a DAP/DAF), or include electrical coupling to the substrate. For example, interconnect features (e.g., pads or lands) on the first IC chip may be bonded to corresponding features on the package substrate. In some such embodiments, a flip-chip bonding process may be employed. At operation 640, a side of the second IC chip is then attached to the free side of the first IC chip. This attachment may either be purely mechanical (e.g., with a DAP/DAF), or include electrical coupling to the first IC chip. For example, interconnect features (e.g., pads or lands) on the second IC chip may be bonded to corresponding features on the first IC chip. Depending on whether the first IC chip was flip-chip bonded to the substrate, or not, the corresponding features providing electrical connection to the second IC chip may either comprise pads or lands of the top-level interconnect metallization or may comprise pads or lands formed as part of the sidewall interconnect traces. Wire bonding or any other point-to-point interconnection technique may then be employed at operation 850 to couple sidewall trace ends to other sidewall trace ends on another chip and/or to points the package substrate. Methods 801 then complete at operation 860 with the output of a sidewall interconnected multi-chip IC package assembly.

Figure 9G:
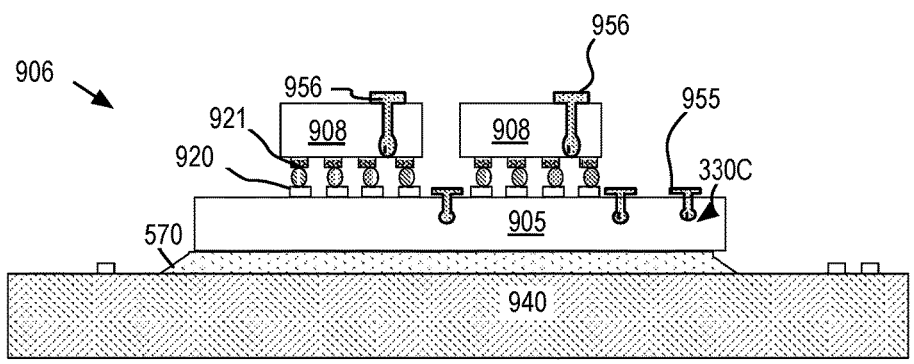
FIGS. 9G and 9H illustrate side views of a multi-chip assembly including an IC chip interconnected to another IC chip through a sidewall interconnect, in accordance with some embodiments.
Figure 9H:
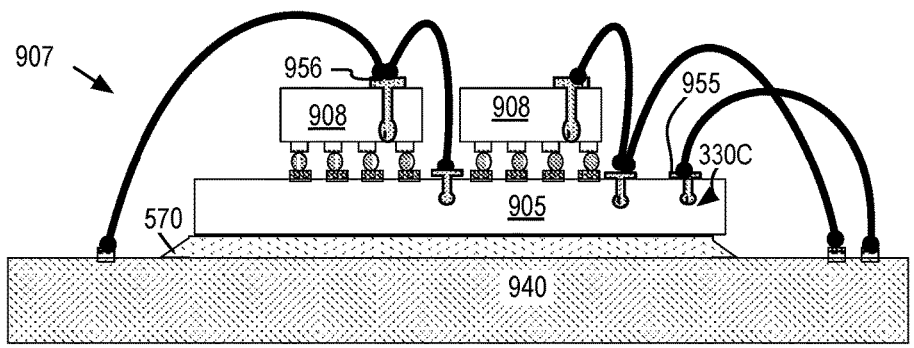

FIG. 9G illustrates a side view of a multi-chip assembly 906 in accordance with some embodiments where a side of IC chip 905 has been attached to a package substrate 940 by DAP/DAF 570. Interconnect features 920 and sidewall traces 350 (e.g., land 955) on the other side of IC chip 905 are then both free to be electrically coupled to IC chip(s) 908 flip-chip bonded to IC chip 905, and/or electrically coupled to a ground/signal/power point on substrate 940. FIG. 9H further illustrates a multi-chip package assembly 907 following wire bonding of sub-assembly 906. As shown, wire bonds may be formed between a sidewall interconnect trace of IC chip 905 and package substrate 940. Wire bonds may also be formed between a sidewall interconnect trace of IC chip(s) 908 and package substrate 940. Wire bonds may also be formed between a sidewall interconnect trace of IC chip(s) 905 and a sidewall interconnect trace of IC chip(s) 908.

Notably, sidewall interconnect trace described herein are not limited to inter-chip connections as they can also be employed as routing within a single chip. For example, levels of interconnect within the same IC chip may be jumpered together by a sidewall trace that makes contact with two, or more traces that intersect the edge sidewall of the chip. This technique can be employed to interconnect device layers fabricated on opposite sides of a substrate, for example that are separated by intervening material, such as bulk silicon.

Figure 10:
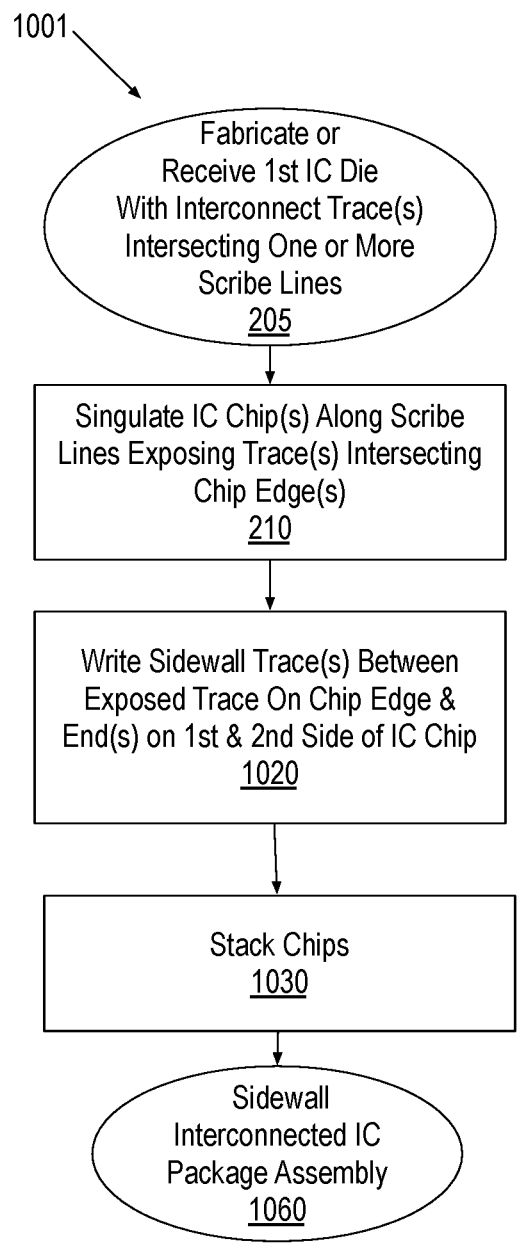
FIG. 10 illustrates a flow diagram of methods for fabricating a chip assembly including a first IC chip with opposite sides of a semiconductor layer interconnected through a sidewall interconnect trace, in accordance with some embodiments.
Figure 11A:
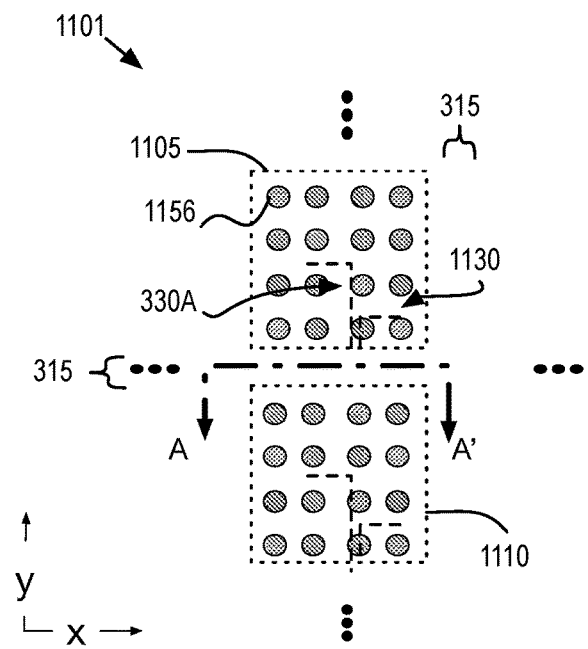
FIG. 11A illustrates a top-down plan view of a first side of an IC chip that is to be sidewall interconnected, in accordance with some embodiments.
Figure 11B:
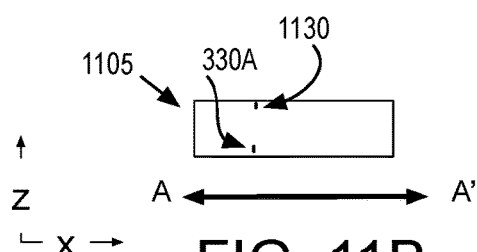
FIG. 11B illustrates a sidewall of the IC chip illustrated in FIG. 11A, in accordance with some embodiments.

FIG. 10 illustrates a flow diagram of methods for fabricating a chip assembly including a first IC chip with opposite sides of a semiconductor layer interconnected through a sidewall interconnect trace, in accordance with some embodiments. Methods 1001 include operation 205 where a first IC die is fabricated or received, for example substantially as described elsewhere herein. At operation 210, the first IC die is singulated from the fabrication substrate to generate a first IC chip having at least one interconnect trace intersecting the chip edge. FIG. 11A illustrates a top-down plan view of a first side of an IC chip that is to be sidewall interconnected, in accordance with some embodiments of methods 1001. As shown in FIG. 11A, fabrication substrate 1101 includes a die 1105 and a die 1110 separated by intervening street 315. In this embodiment, a top metallization level includes conductive interconnect features 1156 suitable for attaching to another die or package substrate. Interconnect traces 330A-330D may be substantially as described above for any of the embodiments illustrated in FIG. 3A. Second interconnect traces 1130 are similarly present on the opposite side of the die (i.e., back-side). Second interconnect traces 1130 may have been fabricated during back-side processing, and may, for example interconnect devices (e.g., transistors or memory cells, etc.) that have been fabricated on the back side of a fabrication substrate (e.g., bulk silicon or other known substrate). FIG. 11B illustrates a sidewall of IC chip 1105 upon singulation from substrate 1101 along the A-A' singulation line. As shown, between traces 330A and 1130 is bulk chip material (e.g., silicon).

Figure 11C:
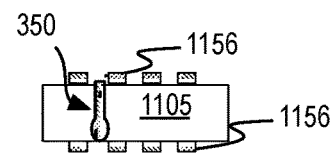
FIG. 11C illustrates a sidewall of the IC chip illustrated in FIG. 11B, in accordance with some embodiments.

Returning to FIG. 8, methods 801 continue with the formation of one or more conductive sidewall traces at operation 1020. The sidewall traces may be formed between the exposed traces one or more edges of the first IC chip (e.g., coupling a bottom-side interconnect metallization level to a top-side interconnect metallization level of the chip). Operation 1020 may entail any of the trace formation techniques described above, for example in the context of operation 130 (FIG. 1). In some exemplary embodiments, conductive sidewall traces are printed with an ink, paste, or powder, that is subsequently cure and/or sintered. FIG. 11C illustrates a side view of IC chip 1105 following formation of sidewall interconnect traces 350, in accordance with some embodiments. As shown, sidewall interconnect traces 350 terminate at the traces 330A and 1130. Back-side interconnect features 1156 (e.g., pads or lands) may be fabricated as top-level metallization for back side of IC chip 1105.

With the sidewall traces present on the IC chips, they may be attached to each other, and/or attached to a third IC chip, and/or attached to a package substrate. Alternatively, some or all die attachment operations may be performed prior to forming the sidewall traces. In the exemplary embodiment illustrated in FIG. 10, methods 1001 proceed to operation 1030 where the IC chip is attached to another chip (e.g., singulated from the same fabrication substrate). For example, interconnect features (e.g., pads or lands) on a first side of the IC chip may be bonded to corresponding features on the second side of the IC chip. In some such embodiments, a flip-chip bonding process may be employed. Device interconnect layers on opposite sides of stack chips are then interconnected through their top-level features with the sidewall traces providing interconnect between interconnect levels on opposite sides of each IC chip. Methods 1001 then complete at operation 1060 with the output of a sidewall interconnected multi-chip IC package assembly.

Figure 11D:
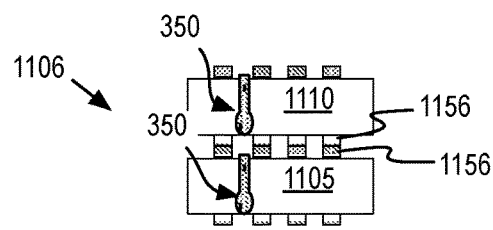
FIG. 11D illustrate side views of a multi-chip assembly including IC chips with interconnect layers on opposite sides of the IC chip interconnected through a sidewall interconnect, in accordance with some embodiments.

FIG. 11D illustrates a side view of a multi-chip assembly 1106 in accordance with some embodiments where IC chip 905 has been attached to IC chip 910 through corresponding interconnect features 1156. Sidewall traces 350 on the sides of IC chips 905, 910 may then convey one or more of a ground/signal/power point on a package substrate (not depicted) through interconnect levels separated by intervening chip material (e.g., semiconductor, and/or dielectric).

Figure 12:
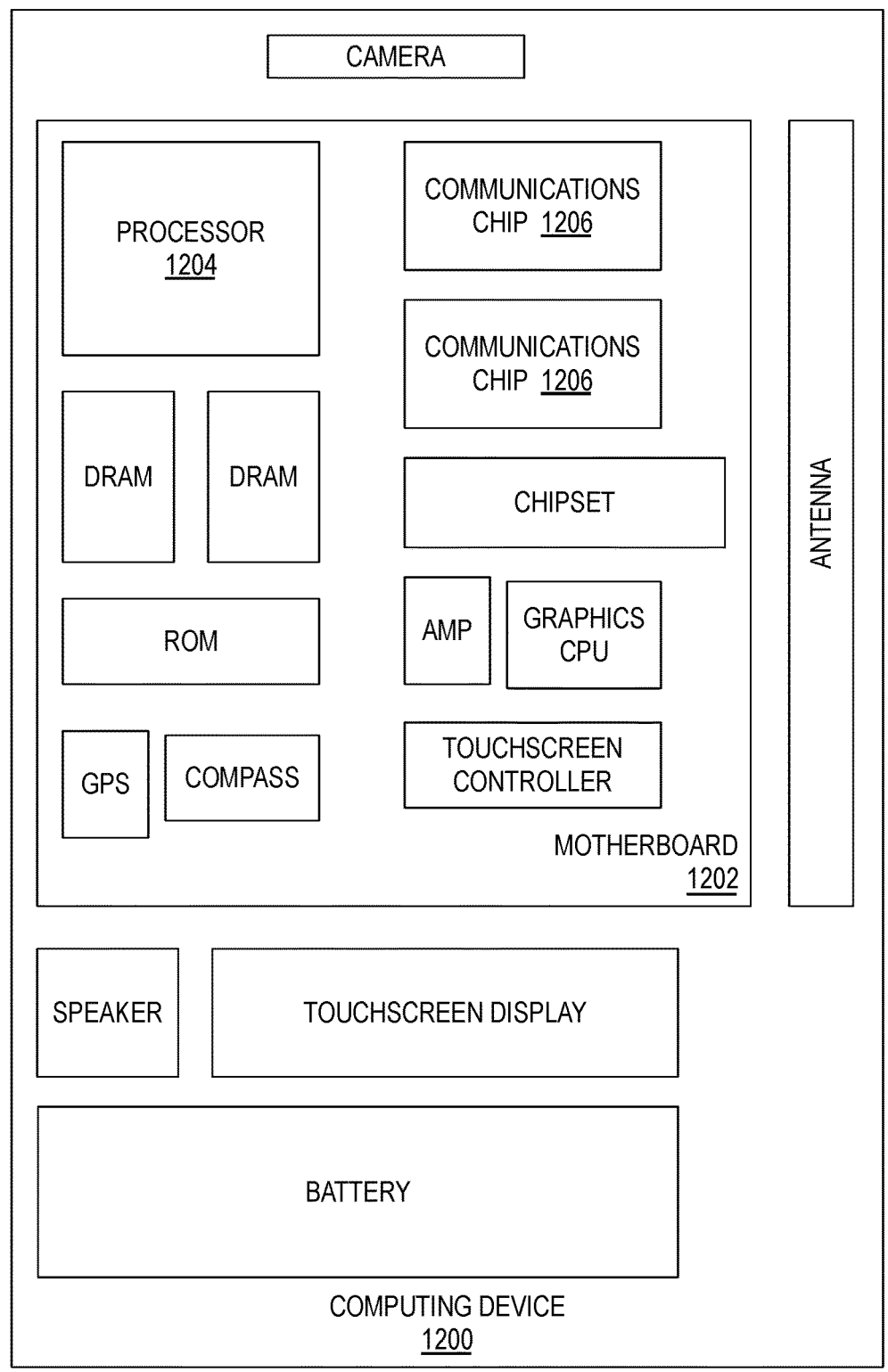
FIG. 12 is a functional block diagram of an electronic computing device, in accordance with some embodiments.

FIG. 12 is a functional block diagram of an electronic computing device, in accordance with an embodiment of the present invention. Device 1200 further includes a motherboard 1202 hosting a number of components, such as, but not limited to, a processor 1204 (e.g., an applications processor). Processor 1204 may be physically and/or electrically coupled to motherboard 1202. In some examples, processor 1204 includes an integrated circuit die packaged within the processor 1204. In general, the term "processor" or "microprocessor" may refer to any device or portion of a device that processes electronic data from registers and/or memory to transform that electronic data into other electronic data that may be further stored in registers and/or memory.

In various examples, one or more communication chips 1206 may also be physically and/or electrically coupled to the motherboard 1202. In further implementations, communication chips 1206 may be part of processor 1204. Depending on its applications, computing device 1200 may include other components that may or may not be physically and electrically coupled to motherboard 1202. These other components include, but are not limited to, volatile memory (e.g., DRAM), non-volatile memory (e.g., ROM), flash memory (e.g., NAND or NOR), a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like. In some exemplary embodiments, at least the flash memory comprises a stacked-chip assembly including sidewall interconnect traces, for example as described elsewhere herein.

Communication chips 1206 may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1206 may implement any of a number of wireless standards or protocols, including but not limited to those described elsewhere herein. As discussed, computing device 1200 may include a plurality of communication chips 1206. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

Figure 13:
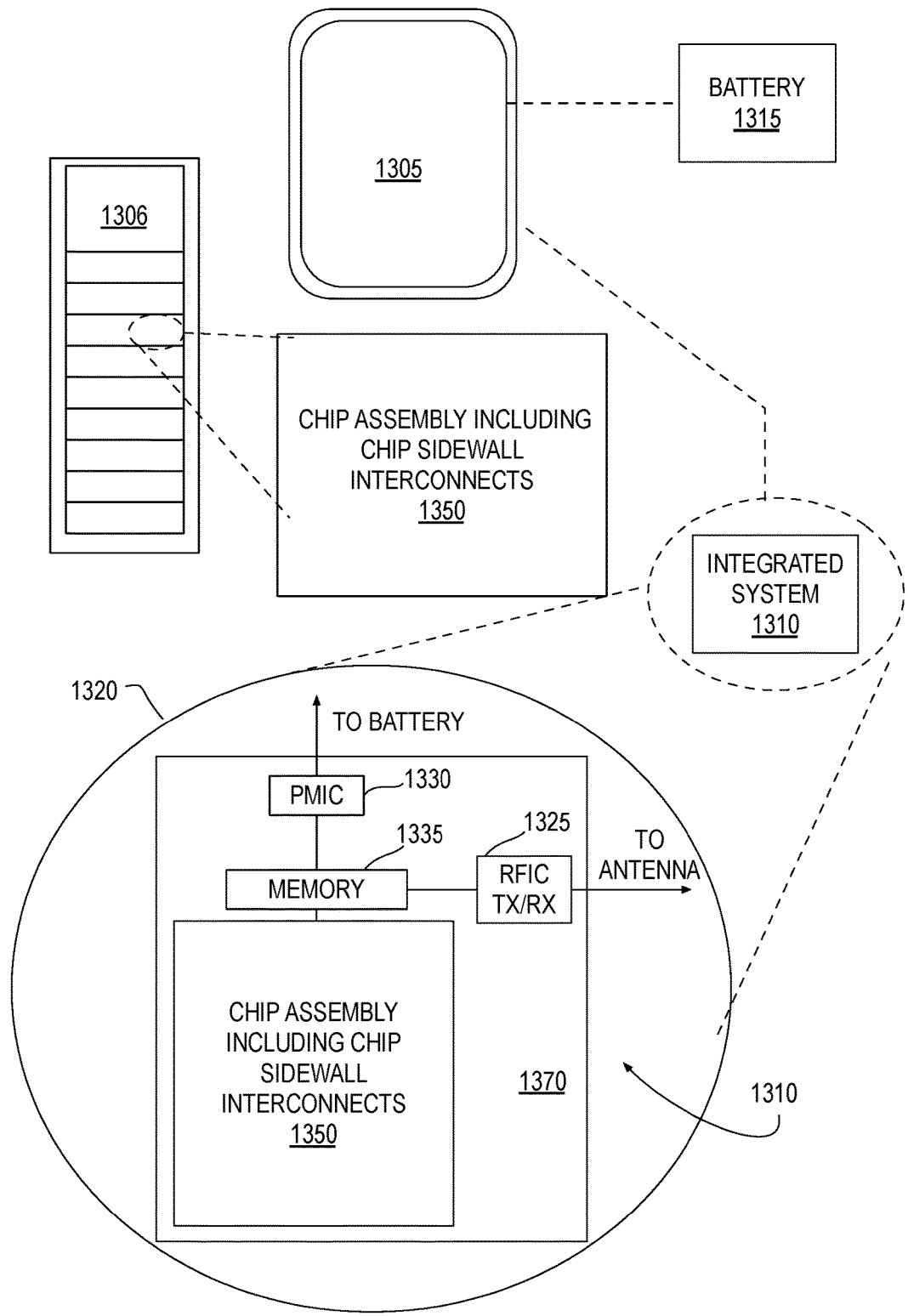
FIG. 13 illustrates a mobile computing platform and a data server machine employing a chip assembly including sidewall interconnects, in accordance with some embodiments.

FIG. 13 illustrates a mobile computing platform and a data server machine employing a multi-chip assembly including one or more sidewall interconnect traces, for example as described elsewhere herein. Computing device 1200 may be found inside platform 1305 or server machine 1306, for example. The server machine 1306 may be any commercial server, for example including any number of high-performance computing platforms disposed within a rack and networked together for electronic data processing, which in the exemplary embodiment includes a packaged monolithic SoC 1350. The mobile computing platform 1305 may be any portable device configured for each of electronic data display, electronic data processing, wireless electronic data transmission, or the like. For example, the mobile computing platform 1305 may be any of a tablet, a smart phone, laptop computer, etc., and may include a display screen (e.g., a capacitive, inductive, resistive, or optical touchscreen), a chip-level or package-level integrated system 1310, and a battery 1315.

Whether disposed within the integrated system 1310 illustrated in the expanded view 1320, or as a stand-alone chip within the server machine 1306, chip assembly 1350 includes a chip with a sidewall interconnect trace, for example as described elsewhere herein. In some embodiments, chip assembly 1350 includes at least one processor chip and at least one memory chip with a sidewall interconnect trace on either chip or on both chips. In some further embodiments, chip assembly 1350 includes a DRAM or NAND flash chip and a processor chip, at least one of which includes a sidewall interconnect trace, for example as described elsewhere herein. Chip assembly 1350 may be further coupled to a board, a substrate, or an interposer 1360 along with, one or more of a power management integrated circuit (PMIC) 1330, RF (wireless) integrated circuit (RFIC) 1325 including a wideband RF (wireless) transmitter and/or receiver (TX/RX) (e.g., including a digital baseband and an analog front end module further comprises a power amplifier on a transmit path and a low noise amplifier on a receive path), and a controller 1335.

Functionally, PMIC 1330 may perform battery power regulation, DC-to-DC conversion, etc., and so has an input coupled to battery 1315 and with an output providing a current supply to other functional modules. As further illustrated, in the exemplary embodiment, RFIC 1325 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G+, and beyond.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one or more first examples, an integrated circuit (IC) chip assembly, comprises a first IC chip, and a sidewall interconnect trace including a first end contacting a conductive trace intersecting an edge sidewall of the first IC chip, and including a second end electrically coupled to at least one of: a second conductive trace intersecting an edge sidewall of the first IC chip; a second IC chip; or a substrate to which the assembly is mounted.

In one or more second examples, for any of the first examples the sidewall interconnect trace traverses a length of the edge sidewall separating the conductive trace from the second conductive trace, the second IC chip, or substrate to which the sidewall interconnect trace is coupled.

In one or more third examples, for any of the first or second examples the sidewall interconnect trace has a width less than 300 µm and having a thickness, from an underlying interface with the edge sidewall, that is less than 30 µm.

In one or more fourth examples, for any of the first, second, or third examples the sidewall interconnect trace comprises Ag, Au, Al, or Cu.

In one or more fifth examples, for any of the first, second, third, or fourth examples the sidewall interconnect trace comprises an epoxy resin with a metallic filler including the Ag or Cu.

In one or more sixth examples, for any of the first, second, third, or fourth examples the sidewall interconnect trace is a metal comprising the Ag, Au, Al, or Cu.

In one or more seventh examples, for any of the first, second, third, fourth, fifth, or sixth examples a first side of the first IC chip includes a plurality of first metal interconnect features bonded to corresponding metal interconnect features on the substrate, and the second end of the sidewall interconnect trace is coupled to the second IC chip.

In one or more eighth examples, for any of the first, second, third, fourth, fifth, sixth, or seventh examples the second end of the sidewall interconnect trace comprises a pad to which a metal interconnect feature on a first side of the second IC chip is electrically coupled.

In one or more ninth examples, for any of the first, second, third, fourth, fifth, sixth, seventh, or eighth examples a die-attach paste or film is contacts a side of the first or second IC chip, and the sidewall interconnect trace traverses a thickness of the die-attach paste or film.

In one or more tenth examples, for any of the first, second, third, fourth, fifth, sixth, seventh, eighth, or ninth examples a first side of the first IC chip includes a plurality of first metal interconnect features bonded to corresponding metal interconnect features on the substrate. A first side of the second IC chip is attached to a second side of the first IC chip by the die-attach paste or film. The second end of the sidewall interconnect trace contacts a conductive trace intersecting an edge sidewall of the second IC chip.

In one or more eleventh examples, for any of the first, second, third, fourth, fifth, sixth, seventh, eighth, ninth, or tenth examples a first side of the first IC chip includes a plurality of first metal interconnect features bonded to corresponding metal interconnect features on the substrate. The first side of the first IC chip includes a plurality of second metal interconnect features bonded to corresponding metal interconnect features on a side of the second IC chip. The second end of the sidewall interconnect trace is electrically coupled to the substrate through a bond wire.

In one or more twelfth examples, for any of the first, second, third, fourth, fifth, sixth, seventh, eighth, ninth, tenth, or eleventh examples a first side of the first IC chip includes a plurality of first metal interconnect features bonded to corresponding metal interconnect features of the second IC chip. The sidewall interconnect trace extends from the edge sidewall to a second side of the first IC chip. The second end of the sidewall interconnect trace is electrically coupled to the substrate through a bond wire.

In one or more thirteenth examples, for any of the first, second, third, fourth, fifth, sixth, seventh, eighth, ninth, tenth, eleventh, or twelfth examples a first side of the second IC chip is attached to the substrate by a die-attach paste or film. A second sidewall interconnect trace extends from a first end contacting a conductive trace intersecting an edge sidewall of the second IC chip to a second end electrically coupled to the first IC chip or the substrate through another bond wire.

In one or more fourteenth examples, for any of the first, second, third, fourth, fifth, sixth, seventh, eighth, ninth, tenth, eleventh, twelfth, or thirteenth examples the conductive trace intersecting the edge sidewall is within a level of interconnect metallization on a first side of the first IC chip, and is separated from a second conductive trace intersecting the edge sidewall by a thickness of semiconductor, the second trace being within a level of interconnect metallization on a second side of the first IC chip. The sidewall interconnect trace contacts the second conductive trace, electrically coupling interconnect levels on opposite sides of the IC chip.

In one or more fifteenth examples, for any of the first, second, third, fourth, fifth, sixth, seventh, eighth, ninth, tenth, eleventh, twelfth, thirteenth, or fourteenth examples the sidewall trace interconnects a plurality of conductive traces intersecting the edge sidewall of the first IC chip.

In one or more sixteenth examples, a memory chip assembly, comprises a package substrate including a plurality of signal pads, a first memory IC chip, and a second memory IC chip. The assembly comprises a sidewall interconnect trace contacting a conductive trace within the first chip that intersects an edge sidewall of the first chip, and electrically coupled to at least one of the second chip or one of the signal pads.

In one or more seventeenth examples, for any of the sixteenth examples the first and second IC chips are NAND flash memory chips, and the sidewall interconnect trace contacts a conductive trace within the second chip that intersects an edge sidewall of the second chip.

In one or more eighteenth examples, a method of assembling an integrated circuit (IC) chip package, the method comprises defining a sidewall edge of a first IC chip by singulating the first IC chip from a plurality of IC die, the singulating exposing an interconnect trace intersecting the sidewall edge of the first IC chip. The method comprises forming a sidewall interconnect trace extending from a first end that contacts the exposed interconnect trace to a second end electrically coupled to at least one of a second IC chip or a package substrate.

In one or more nineteenth examples, for any of the eighteenth examples forming the sidewall interconnect trace further comprises printing an ink or paste that comprises conductive material or a precursor thereof.

In one or more twentieth examples, for any of the eighteenth or nineteenth examples forming the sidewall interconnect trace further comprises writing the sidewall interconnect trace between the first end and a location on a first side of the first IC chip. The method further comprises attaching a second side of the first IC chip to the package substrate, and coupling an interconnect feature on the second IC chip to the second end of the sidewall interconnect trace.

In one or more twenty-first examples, for any of the eighteenth, nineteenth, or twentieth examples the method further comprises defining a sidewall edge of the second IC chip by singulating the second IC chip from a plurality of IC chips, the singulating exposing an interconnect trace intersecting the sidewall edge of the second IC chip. The method comprises attaching a side of the first IC chip to a side of the second IC chip. Forming the sidewall interconnect trace further comprises writing the sidewall interconnect trace between the first end and a second end that contacts the interconnect trace intersecting the sidewall edge of the second IC chip.

In one or more twenty-second examples, for any of the eighteenth, nineteenth, twentieth, or twenty-first examples, the method further comprises flip-chip attaching a first side of first IC chip to a side of the second IC chip, flip-chip attaching a first side of first IC chip to the substrate; and forming a wire bond between the substrate and a second end of the sidewall interconnect trace.

In one or more twenty-third examples, for any of the eighteenth, nineteenth, twentieth, twenty-first or twenty-second examples, forming the sidewall interconnect trace further comprises writing the sidewall interconnect trace between the first end and a location on a first side of the first IC chip. The method further comprises defining a sidewall edge of the second IC chip by singulating the second IC chip from a plurality of IC chips, the singulating exposing an interconnect trace intersecting the sidewall edge of the second IC chip. The method further comprises forming a second sidewall interconnect trace between a first end contacting the interconnect trace intersecting the sidewall edge of the second IC chip and a location on a first side of the second IC chip. The method further comprises attaching a second side of the first IC chip to the substrate. The method further comprises attaching a second side of the second IC chip to the first side of the first IC chip. The method further comprises forming wire bonds between the substrate and the first and second sidewall interconnect traces.

In one or more twenty-fourth examples, for any of the eighteenth, nineteenth, twentieth, twenty-first, twenty-second, or twenty-third examples, the method further comprises fabricating the interconnect trace within a street disposed between adjacent ones of the plurality of IC die.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) chip assembly, comprising:
   a first IC die comprising a first interconnect metallization level below a second interconnect metallization level; and
   a sidewall interconnect trace in contact with a conductive trace in the first interconnect metallization level that intersects an edge sidewall of the first IC die, wherein the sidewall interconnect trace is electrically coupled to at least one of:
   a second conductive trace intersecting an edge sidewall of the first IC die;
   a second IC die; or
   a substrate of the assembly.

2. The IC chip assembly of claim 1, wherein:
   the sidewall interconnect trace is over a length of the edge sidewall that separates the conductive trace from the second trace, the second IC die, or substrate to which the sidewall interconnect trace is coupled.

3. The IC chip assembly of claim 2, wherein the sidewall interconnect trace has a width less than 300 μm and has a thickness, from an underlying interface with the edge sidewall, that is less than 30 μm.

4. The IC chip assembly of claim 3, wherein the sidewall interconnect trace comprises Ag, Au, Al, or Cu.

5. The IC chip assembly of claim 4, wherein the sidewall interconnect trace comprises an epoxy resin with a metallic filler including the Ag or Cu.

6. The IC chip assembly of claim 4, wherein the sidewall interconnect trace is a metal comprising the Ag, Au, Al, or Cu.

7. The IC chip assembly of claim 1, wherein:
   a first side of the first IC die includes a plurality of first metal interconnect features bonded to corresponding metal interconnect features on the substrate; and
   the sidewall interconnect trace is coupled to the second IC die.

8. The IC chip assembly of claim 7, wherein:
   the sidewall interconnect trace comprises a pad to which a metal interconnect feature on a first side of the second IC die is electrically coupled.

9. The IC chip assembly of claim 1, wherein:
   a die-attach paste or film is in contact with a side of the first or second IC die; and
   the sidewall interconnect trace is over a thickness of the die-attach paste or film.

10. The IC chip assembly of claim 9, wherein:
a first side of the first IC die includes a plurality of first metal interconnect features bonded to corresponding metal interconnect features on the substrate;
a first side of the second IC die is attached to a second side of the first IC die by the die-attach paste or film; and
the sidewall interconnect trace contacts a conductive trace that intersects an edge sidewall of the second IC die.

11. The IC chip assembly of claim 1, wherein:
a first side of the first IC die includes a plurality of first metal interconnect features bonded to corresponding metal interconnect features on the substrate;
the first side of the first IC die includes a plurality of second metal interconnect features bonded to corresponding metal interconnect features on a side of the second IC die; and
the sidewall interconnect trace is electrically coupled to the substrate through a bond wire.

12. An integrated circuit (IC) chip assembly, comprising:
a first IC chip; and
a sidewall interconnect trace in contact with a conductive trace that intersects an edge sidewall of the first IC chip, wherein the sidewall interconnect trace is electrically coupled to a second IC chip;
a first side of the first IC chip includes a plurality of first metal interconnect features bonded to corresponding metal interconnect features of the second IC chip;
the sidewall interconnect trace extends from the edge sidewall to a second side of the first IC chip; and
the sidewall interconnect trace is electrically coupled through a bond wire to a substrate of the assembly.

13. The IC chip assembly of claim 12, wherein:
a first side of the second IC chip is attached to the substrate by a die-attach paste or film; and
a second sidewall interconnect trace contacts a conductive trace intersecting an edge sidewall of the second IC chip and couples the conductive trace to the first IC chip or the substrate through another bond wire.

14. An integrated circuit (IC) chip assembly, comprising:
an IC chip comprising a first conductive trace that intersects an edge sidewall of the IC chip; and
a sidewall interconnect trace in contact with the first conductive trace, wherein:
the first conductive trace is within a level of interconnect metallization on a first side of the IC chip, and is separated from a second conductive trace that intersects the edge sidewall by a thickness of semiconductor, the second trace within a level of interconnect metallization on a second side of the IC chip; and
the sidewall interconnect trace contacts the second conductive trace, electrically coupling interconnect metallization levels on opposite sides of the IC chip.

15. The IC chip assembly of claim 1, wherein the sidewall trace interconnects a plurality of conductive traces that intersect the edge sidewall of the first IC die.

16. A memory chip assembly, comprising:
a package substrate including a plurality of signal pads;
a first memory IC die comprising a first interconnect metallization level below a second interconnect metallization level;
a second memory IC die; and
a sidewall interconnect trace in contact with a conductive trace in the first interconnect metallization level, wherein the conductive trace intersects an edge sidewall of the first die, and the sidewall interconnect trace is electrically coupled to at least one of: the first die; the second die; or one of the signal pads.

17. The memory chip assembly of claim 16, wherein:
the first and second IC die are NAND flash memory die; and
the second end of the sidewall interconnect trace contacts a conductive trace within the second die that intersects an edge sidewall of the second die.

* * * * *